United States Patent
Cole

(10) Patent No.: US 9,777,999 B2
(45) Date of Patent: Oct. 3, 2017

(54) METHODS AND SYSTEMS FOR PROVIDING PROTECTION FROM PROJECTILES

(71) Applicant: CISCO TECHNOLOGY, INC., San Jose, CA (US)

(72) Inventor: George Glen Daniel Cole, Allen, TX (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 47 days.

(21) Appl. No.: 14/814,039

(22) Filed: Jul. 30, 2015

(65) Prior Publication Data
US 2016/0102951 A1    Apr. 14, 2016

Related U.S. Application Data

(60) Provisional application No. 62/062,684, filed on Oct. 10, 2014.

(51) Int. Cl.
| | |
|---|---|
| *F41H 5/24* | (2006.01) |
| *H05K 7/14* | (2006.01) |
| *F41H 5/04* | (2006.01) |

(52) U.S. Cl.
CPC ............. *F41H 5/24* (2013.01); *F41H 5/0428* (2013.01); *F41H 5/0492* (2013.01); *H05K 7/1495* (2013.01)

(58) Field of Classification Search
CPC ... F41H 5/24; F41H 1/02; F41H 5/013; F41H 5/0478; F41H 5/08; F41H 5/0428; F41H 5/0492; H05K 7/1495
See application file for complete search history.

(56) References Cited

U.S. PATENT DOCUMENTS 3,061,839 A * 11/1962 Foster .................... F41H 1/02
                                                                 2/2.5
4,785,136 A * 11/1988 Mollet .................. G06F 1/182
                                                                 174/363
(Continued)

FOREIGN PATENT DOCUMENTS

CN          202745420 U         2/2013

OTHER PUBLICATIONS

Kabay, "Facilities Security and Information Assurance," MSIA Program, Norwich University, Jan. 2008, 15 pages; http://www.mekabay.com/opsmgmt/facilities_security.pdf.

*Primary Examiner* — Adrian S Wilson
*Assistant Examiner* — Abhishek Rathod
(74) *Attorney, Agent, or Firm* — Polsinelli PC

(57) ABSTRACT

The systems and methods disclosed herein relate to shielding electronic devices with respect to, among other things, projectiles. In some embodiments, an apparatus comprises a plurality of projectile-resistant panels corresponding to exterior surfaces of an electronic device. The apparatus wraps the electronic device, wherein each of the plurality of projectile-resistant panels covers a solid surface of the exterior surfaces of the electronic device and does not cover a perforated surface of the exterior surfaces of the electronic device. In further examples, the apparatus further comprises at least one fabric sheet forming a plurality of pockets in which to receive the plurality of projectile-resistant panels; and an articulation located between a pair of adjacent pockets of the plurality of pockets. The articulation facilitates the apparatus wrapping the electronic device by enabling rotation, relative to one another and about the articulation, between a first projectile-resistant panel and a second projectile-resistant panel.

20 Claims, 13 Drawing Sheets

(56) References Cited

U.S. PATENT DOCUMENTS

| | | | |
|---|---|---|---|
| 4,923,728 A * | 5/1990 | Snedeker | B32B 3/18 2/2.5 |
| 6,064,711 A | 5/2000 | Copson | |
| 6,161,738 A * | 12/2000 | Norris | A45C 9/00 109/49.5 |
| 2002/0145849 A1* | 10/2002 | Peterson, III | G06F 1/163 361/679.03 |
| 2009/0096918 A1* | 4/2009 | Montelongo | H04N 5/2252 348/375 |
| 2009/0272662 A1 | 11/2009 | Lin et al. | |
| 2010/0083428 A1* | 4/2010 | McElroy | F41H 1/02 2/456 |
| 2010/0110634 A1* | 5/2010 | Woodbury, II | B62B 5/0026 361/698 |
| 2010/0282062 A1* | 11/2010 | Sane | F41H 5/007 89/36.02 |
| 2010/0283532 A1* | 11/2010 | Horan | G09G 5/003 327/530 |
| 2011/0085300 A1* | 4/2011 | Sivanandan | H05K 7/20172 361/694 |
| 2011/0260924 A1* | 10/2011 | Roy | H01Q 1/38 343/700 MS |
| 2012/0174274 A1* | 7/2012 | Maliakal | B29C 51/02 2/2.5 |
| 2013/0193149 A1 | 8/2013 | Balourdet | |

* cited by examiner

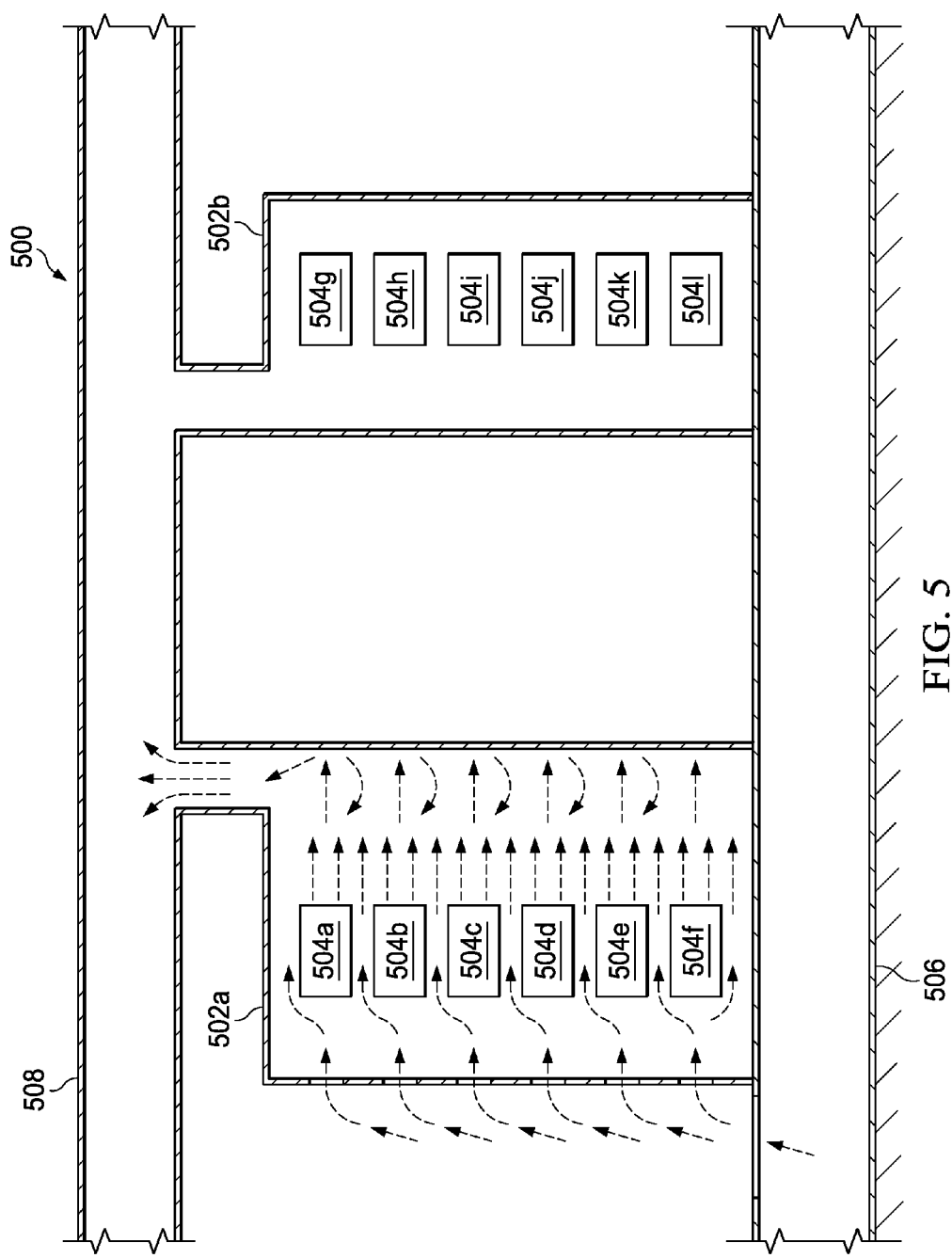

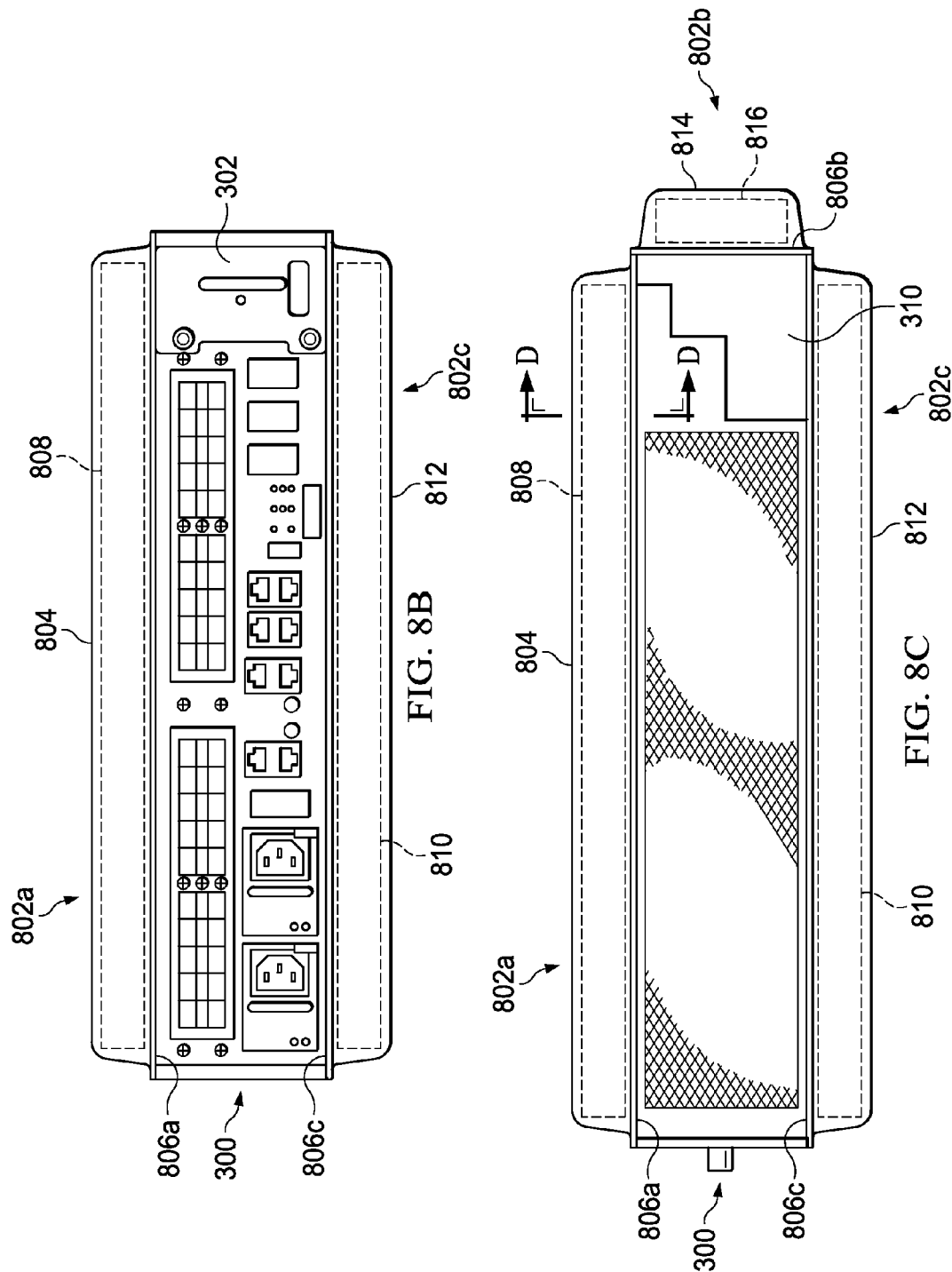

METHODS AND SYSTEMS FOR PROVIDING PROTECTION FROM PROJECTILES

CROSS-REFERENCE TO RELATED APPLICATIONS

This application claims the benefit of priority under 35 U.S.C. §119(e) to U.S. Provisional Application Ser. No. 62/062,684, entitled "METHODS AND SYSTEMS FOR PROVIDING PROTECTION FROM PROJECTILES" filed Oct. 10, 2014, which is hereby incorporated by reference in its entirety.

TECHNICAL FIELD

This disclosure relates in general to the field of communications and, more particularly, to protecting electronic devices from projectiles.

BACKGROUND

A data center can store thousands, and in some cases hundreds of thousands, of electronic devices (e.g., servers, routers, etc.). These data centers may be located in environments where they are exposed to many potential sources of damage. Traditional storage systems fail to protect electronic devices from many, potentially serious, sources of damage. Improving protection for electronic devices is a challenge facing data center administrators.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 5 is a simplified schematic diagram of a storage facility according to some embodiments of the present disclosure;

FIGS. 8A, 8B, 8C, and 8D illustrate an exemplary system for shielding electronic devices according to an embodiment of the present disclosure;

DESCRIPTION OF EXAMPLE EMBODIMENTS OF THE DISCLOSURE

Overview

Figure 1:
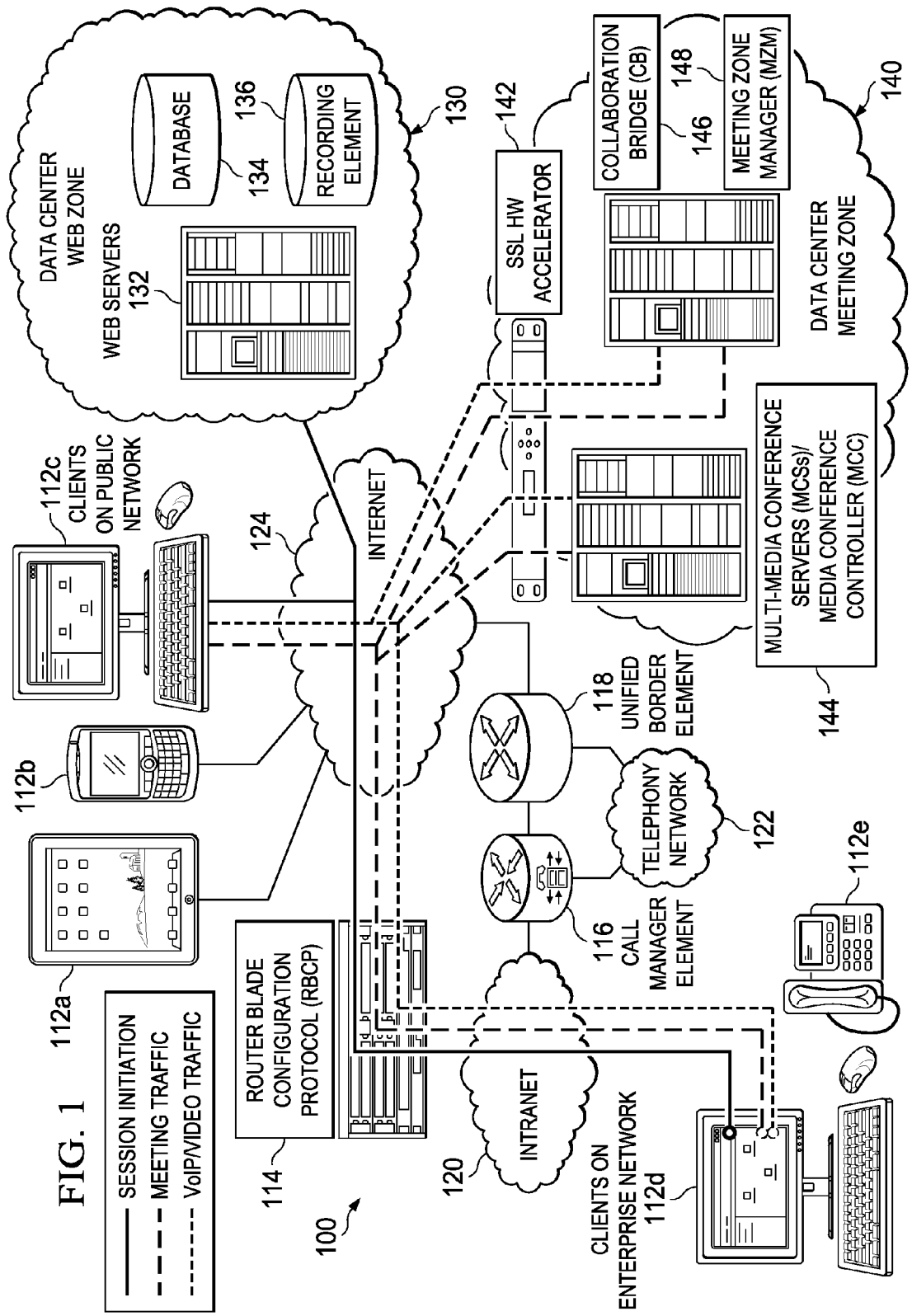
FIG. 1 is a simplified schematic diagram of a system including a plurality of electronic devices in accordance with one embodiment of the present disclosure.

The following examples relate to some embodiments of the present disclosure.

Example 1 is an apparatus comprising: one or more layers to wrap an electronic device, wherein at least one of the one or more layers is to shield the electronic device from a projectile.

In Example 2, the subject matter of Example 1 can optionally include the one or more layers comprising: a first projectile-resistant ceramic layer; a conductive mesh layer; a second projectile-resistant ceramic layer; and a fire resistant layer material.

In Example 3, the subject matter of any of Examples 1 or 2 can optionally include the conductive mesh layer creating a faraday cage around the electronic device.

In Example 4, the subject matter of any of Examples 2-3 can optionally include the conductive mesh layer including grounding points.

In Example 5, the subject matter any of Examples 2-4 can optionally include the conductive mesh layer extending over an airflow intake for the electronic device.

In Example 6, the subject matter of any of Examples 1-5 can optionally include each of the one or more layers being attached to an adjacent layer in one or more layers by an adhesive or a mechanical fastener.

In Example 7, the subject matter of any of Examples 1-6 can optionally include the apparatus being a jacket, wherein the jacket has a fabric outer surface.

In Example 8, the subject matter of any of Examples 1-6 can optionally include the apparatus being a shell, wherein the shell has a rigid outer surface.

In Example 9, the subject matter of any of Examples 1-8 can optionally include each of the one or more layers being conformal to an exterior surface of the electronic device.

In Example 10, the subject matter of any of Examples 1-9 can optionally include the apparatus wrapping a subset of exterior surfaces of the electronic device and not wrapping another subset of the exterior of the electronic device, wherein the subset and the another subset are mutually exclusive and collectively exhaustive of the exterior surfaces of the electronic device.

In Example 11, the subject matter of any of Examples 1-9 can optionally include the electronic device being selected from a group comprising a server, a router, a switch, a hard disk, and a solid-state drive.

In Example 12, the subject matter of any of Examples 1-11 can optionally include the electronic device being a server in a storage rack, the storage rack comprising a plurality of other electronic devices.

Example 13 is a method comprising: shielding an electronic device from a projectile.

In Example 14, the subject matter of Example 13 can optionally include shielding heat radiation, from another device, from contacting the electronic device.

In Example 15, the subject matter of any of Examples 13 or 14 can optionally include shielding one or more electromagnetic waves, generated by another electronic device, from reaching the electronic device.

In Example 16, the subject matter of any of Examples 13-15 can optionally include facilitating a laminar airflow around the electronic device and/or around the apparatus.

In Example 17, the subject matter of any of Examples 13-16 can optionally include the shielding the electronic device from the projectile comprising: receiving a projectile an outer surface of a panel located in a jacket; and dissipating kinetic energy of the projectile through a thickness of the panel.

In Example 18, the subject matter of Example 17 can optionally include stopping, by the panel, the projectile; and preventing, by the panel, the projectile the projectile from reaching the electronic device proximate an inner surface of the panel.

In Example 19, the subject matter of any of Examples 17-18 can optionally include reducing, by the panel, the velocity of the projectile to 0 meters/sec.

Example 20 is an apparatus comprising a jacket for performing any of Examples 13-19.

Example 21 is an apparatus comprising: a plurality of projectile-resistant panels corresponding to exterior surfaces of an electronic device, wherein when the apparatus wraps the electronic device, each of the plurality of projectile-resistant panels covers a solid surface of the exterior surfaces of the electronic device and does not cover a perforated surface of the exterior surfaces of the electronic device.

In Example 22, the subject matter of Example 21 can optionally include the apparatus further comprising: at least one fabric sheet forming a plurality of pockets in which to receive the plurality of projectile-resistant panels; and an articulation located between a pair of adjacent pockets of the plurality of pockets, wherein the articulation facilitates the apparatus wrapping the electronic device by enabling rotation, relative to one another and about the articulation, between a first projectile-resistant panel located in a first pocket of the pair of adjacent pockets and a second projectile-resistant panel located in a second pocket of the pair of adjacent pockets.

In Example 23, the subject matter of any of Examples 21 or 22 can optionally include the apparatus further comprising: an electrically conductive layer embedded within the plurality of projectile-resistant panels, the electrically conductive layer being continuous through each of the plurality of projectile-resistant panels, and when the apparatus wraps the electronic device, the electrically conductive layer defines a faraday cage around the electronic device.

In Example 24, the subject matter of any of Examples 21-23 can optionally include the exterior surfaces of the electronic device comprising: a first subset of the exterior surfaces through which air is exchanged between an exterior and an interior of the electronic device, wherein the solid surface is one of the first subset of the exterior surfaces, and a second subset of the exterior surfaces that substantially prevents air from being exchanged between the exterior and the interior of the electronic device, wherein the perforated surface is one of the second subset of the exterior surfaces; wherein each of the plurality of projectile-resistant panels covers one of the second subset of exterior surfaces and not does not cover any of the first subset of exterior surfaces; and wherein an electrically conductive layer extends over all of the first subset of exterior surfaces and all of the second subset of the exterior surfaces.

In Example 25, the subject matter of any of Examples 23-24 can optionally include the electrically conductive layer being a metal mesh.

In Example 26, the subject matter of any of Examples 23-25 can optionally include the electrically conductive layer including grounding points, the grounding points being coupled to a current sink.

In Example 27, the subject matter of any of Examples 21-26 can optionally include each of the plurality of projectile-resistant panels comprising a projectile-resistant material.

In Example 28, the subject matter of any of Examples 21-27 can optionally include each of the plurality of projectile-resistant panels comprising a projectile-resistant material comprises: each of the plurality of projectile-resistant panels comprises a plurality of layers, and wherein, for each of the plurality of projectile-resistant panels, at least one of the plurality of layers comprises the projectile-resistant material.

In Example 29, the subject matter of any of Examples 21-28 can optionally include the projectile-resistant material being selected from the group consisting of projectile-resistant ceramic, a projectile-resistant metal, a projectile-resistant nanomaterial, and a projectile-resistant synthetic material.

In Example 30, the subject matter of any of Examples 28-29 can optionally include the plurality of layers comprising: a first layer of the projectile-resistant ceramic; the conductive mesh layer; a second layer of the projectile-resistant ceramic; and a fire resistant layer.

In Example 31, the subject matter of any of Examples 22-30 can optionally include the apparatus further comprising: an attachment mechanism coupled to the at least one fabric sheet, wherein the attachment mechanism secures the apparatus in a fixed position relative to the electronic device.

In Example 32, the subject matter of any of Examples 21-31 can optionally include the attachment mechanism comprising: a strap, the strap comprising: a first end coupled to the at least one fabric sheet, and a second end configured to be wrapped about one or more of the exterior surfaces of an electronic device.

In Example 33, the subject matter of any of Examples 22-32 can optionally include each of the plurality of pockets comprising: a first fabric sheet of the at least one fabric sheet; a second fabric sheet of the at least one fabric sheet; and an attachment mechanism that secures the first fabric sheet to the second fabric sheet, the attachment mechanism defining, at least in part, a cavity between the first fabric sheet and the second fabric sheet in which to hold at least one of the plurality of projectile-resistant panels.

In Example 34, the subject matter of any of Examples 21-33 can optionally include the electronic device being selected from a group consisting of a server, a router, a switch, a hard disk, and a solid-state drive.

In Example 35, the subject matter of any of Examples 28-34 can optionally include each of the plurality of layers being attached to an adjacent layer of the plurality of layers.

In Example 36, the subject matter of any of Examples 21-35 can optionally include the electronic device being a server located in a storage rack, the storage rack comprising a plurality of other electronic devices.

In Example 37, the subject matter of Example 36 can optionally include the storage rack comprising: a housing defining a space in which the one or more electronic devices are supported, wherein ones of the plurality of panels that are projectile-resistant panels are only located adjacent to the housing.

In Example 38, the subject matter of any of Examples 21-37 can optionally include the each of the plurality of projectile-resistant panels covers a solid surface of the exterior surfaces comprising: the each of the plurality of projectile-resistant panels having a first size and a first shape that matches a second size and a second shape of the solid surface of the exterior surfaces of the electronic device.

In Example 39, the subject matter of any of Examples 21-38 can optionally include each of the plurality of projectile-resistant panels being conformal to one of the exterior surfaces of the electronic device.

In Example 40, the subject matter of any of Examples 21-39 can optionally include the each of the plurality of projectile-resistant panels being conformal to the one of the exterior surfaces of the electronic device comprises: each of the plurality of layers being conformal to the one of the exterior surfaces of the electronic device.

Example 41 is a system comprising: one or more electronic devices, wherein an electronic device of the one or more electronic devices comprising: a first subset of exterior surfaces through which air is exchanged between an exterior and an interior of the electronic device, and a second subset of exterior surfaces that substantially prevents air from being exchanged between the exterior and the interior of the electronic device; and one or more jackets wrapping the one or more electronic devices, wherein a jacket of the one or more jacket comprises: a plurality of panels, wherein at least one of the plurality of panels is a projectile-resistant panel, and wherein each of the plurality of panels covers one of the second subset of exterior surfaces and not does not cover any of the first subset of exterior surfaces.

In Example 42, the subject matter of Example 41 can optionally include the jacket further comprising: at least one fabric sheet forming a plurality of pockets in which to hold the plurality of projectile-resistant panels; and articulations located between adjacent pockets of the plurality of pockets, wherein the articulations facilitate the jacket wrapping the electronic device by enabling rotation of each of the plurality of panels relative to one another and about the articulations.

In Example 43, the subject matter of any of Examples 41 or 42 can optionally include the jacket further comprising: an electrically conductive layer embedded within the plurality of panels, the electrically conductive layer being continuous through each of the plurality of panels, and when the apparatus wraps the electronic device, the electrically conductive layer defines a faraday cage around the electronic device.

In Example 44, the subject matter of any of Examples 41-43 can optionally include the electrically conductive layer extending over all of the first subset of exterior surfaces and all of the second subset of the exterior surfaces.

In Example 45, the subject matter of any of Examples 41-44 can optionally include the system further comprising a storage rack supporting the one or more electronic devices.

In Example 46, the subject matter of Example 45 can optionally include the storage rack comprising: a housing defining a space in which the one or more electronic devices are supported, wherein ones of the plurality of panels that are projectile-resistant panels are only located adjacent to the housing.

In Example 47, the subject matter of any of Examples 43-46 can optionally include the electrically conductive layer being a metal mesh.

In Example 48, the subject matter of any of Examples 43-47 can optionally include the electrically conductive layer including grounding points, the grounding points being coupled to a current sink.

In Example 49, the subject matter of any of Examples 41-48 can optionally include the at least one of the plurality of panels being a projectile-resistant panel comprising the at least one of the plurality of panels comprises a projectile-resistant material.

In Example 50, the subject matter of any of Examples 41-49 can optionally include the at least one of the plurality of panels comprising a projectile-resistant material comprises: each of the at least one of the plurality of panels comprises a plurality of layers, and wherein, for each of the at least one of the plurality of panels, at least one of the plurality of layers comprises the projectile-resistant material.

In Example 51, the subject matter of any of Examples 41-50 can optionally include the projectile-resistant material being a projectile-resistant ceramic.

In Example 52, the subject matter of any of Examples 50-51 can optionally include the plurality of layers comprising: a first layer of the projectile-resistant ceramic; the conductive mesh layer; a second layer of the projectile-resistant ceramic; and a fire resistant layer.

In Example 53, the subject matter of any of Examples 41-52 can optionally include the jacket further comprising: an attachment mechanism coupled to the at least one fabric sheet, wherein the attachment mechanism secures the jacket in a fixed position relative to the electronic device.

In Example 54, the subject matter of Example 53 can optionally include the attachment mechanism comprising: a strap, the strap comprising: a first end coupled to the at least one fabric sheet, and a second end configured to be wrapped about one or more of the exterior surfaces of an electronic device.

In Example 55, the subject matter of any of Examples 42-54 can optionally include each of the plurality of pockets comprising: a first fabric sheet of the at least one fabric sheet; a second fabric sheet of the at least one fabric sheet; and an attachment mechanism that secures the first fabric sheet to the second fabric sheet, the attachment mechanism defining, at least in part, a cavity between the first fabric sheet and the second fabric sheet in which to hold at least one of the plurality of projectile-resistant panels.

In Example 56, the subject matter of any of Examples 41-55 can optionally include each of the one or more electronic devices being selected from a group consisting of a server, a router, a switch, a hard disk, and a solid-state drive.

In Example 57, the subject matter of any of Examples 41-56 can optionally include the each of the plurality of panels covering one of the second subset of exterior surfaces comprises: the each of the plurality of panels having a first size and a first shape that matches a second size and a second shape of the one of the second subset of exterior surfaces of the electronic device.

In Example 58, the subject matter of any of Examples 41-57 can optionally include each of the plurality of panels being conformal to one of the exterior surfaces of the electronic device.

In Example 59, the subject matter of any of Examples 41-58 can optionally include the each of the plurality of panels being conformal to the one of the exterior surfaces of the electronic device comprises: each of the plurality of layers being conformal to the one of the exterior surfaces of the electronic device.

Example Embodiments

FIG. 1 is a simplified block diagram illustrating a communication system 100 including a plurality of electronic devices in accordance with one embodiment of the present disclosure. In specific implementations, communication system 100 can be provisioned for use in generating, managing, hosting, and/or otherwise providing data in a network environment. The architecture of communication system 100 is applicable to any type of network technology such as video conferencing architectures (e.g., Telepresence™), web cam configurations, smartphone deployments, personal computing applications (e.g., Skype™), multimedia meeting platforms (e.g., MeetingPlace™, WebEx™, etc.), desktop applications, or any other suitable communication environments.

Communication system 100 may include any number of endpoints 112a-e that can achieve suitable network connectivity via various points of attachment. In this particular example, communication system 100 includes an Intranet 120, a telephony network 122, and Internet 124, which (in this particular example) offers a pathway to a data center web zone 130 and a data center meeting zone 140. Telephony network 122 may include, among other things, a voice over Internet protocol (VoIP) gateway and a public switched telephone network (PSTN).

Data center web zone 130 includes a plurality of web servers 132, a database 134, and a recording element 136. Data center meeting zone 140 includes a secure sockets layer hardware (SSL HW) accelerator 142, a plurality of multimedia conference servers (MCSs)/media conference controller (MCC) 144, a collaboration bridge 146, and a meeting zone manager 148. As a general proposition, each MCS can be configured to coordinate data (e.g., video and voice) traffic for a given online communication (e.g., a virtual meeting). Additionally, each MCC can be configured to manage the MCS from data center meeting zone 140.

Note that various types of routers and switches can be used to facilitate communications amongst any of the elements of FIG. 1. For example, a call manager element 116 and a unified border element 118 can be provisioned between telephony network 122 and Intranet 120. The call manager element is a network manager for IP phones. Also depicted in FIG. 1 are a number of pathways (e.g., shown as solid or broken lines) between the elements for propagating meeting traffic, session initiation, and voice over Internet protocol (VoIP)/video traffic.

Figure 2:
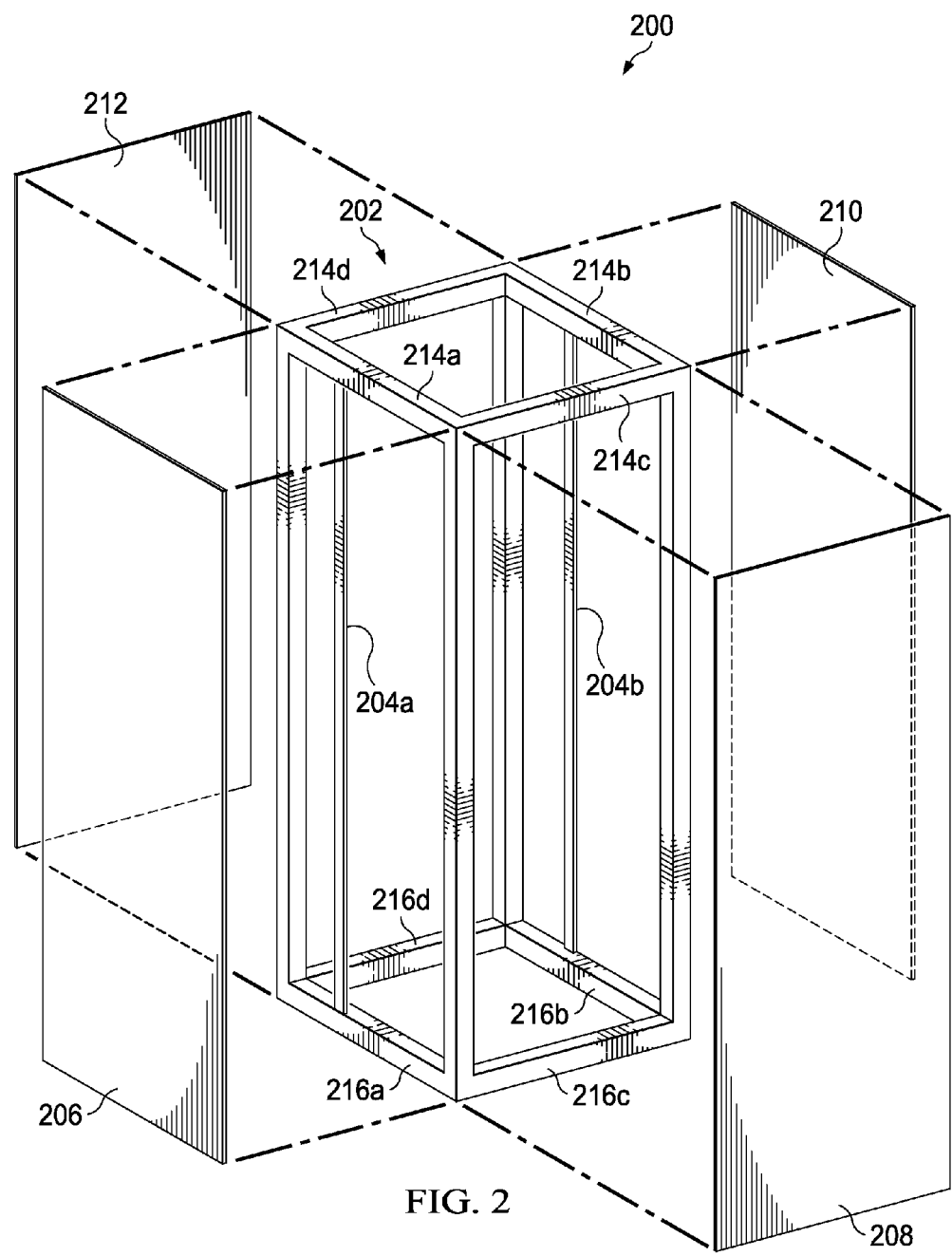
FIG. 2 is an exploded isometric view of an exemplary system for storing electronic devices according to some embodiments of the present disclosure.

FIG. 2 is an exploded isometric view of an exemplary system for storing electronic devices according to some embodiments of the present disclosure. For example, a data center (e.g., data center 130 and/or data center 140) may include a plurality of servers (i.e., in this case, the electronic devices) and a plurality of racks (i.e., in this case, the systems for storing electronic devices) in which to store the servers. FIG. 2 illustrates an exemplary rack 200. Rack 200 includes chassis 202 and walls 206, 208, 210, and 212. The walls form a housing, which defines a space in which the plurality of servers are supported. Chassis 202 comprises, among other things, upper framing elements 214a-d, lower framing elements 216a-d, and device supports 204a and 204b, which frame the edges of a rectangular tube. In this case, the framing elements 214a-d and 216a-d are tubular bars (i.e., rectangular in cross section) made of a rigid material (e.g., metal, plastic, etc.). The chassis 202 supports, between upper framing elements 214a-d and lower framing elements 216a-d, device supports 204a and 204b. In particular, upper framing element 214a supports a first end of the device support 204a; lower framing element 216a supports a second end of the device support 204a. Upper framing element 214b supports a first end of the device support 204b; lower framing element 216b supports a second end of the device support 204b. Each of device supports 204a and 204b are operable to support one or more electronic devices such as a server, a router, a switch, a hard disk, a solid-state drive, or other electronic device that can support functions of a data center, or any other electronic device.

Figure 3A:
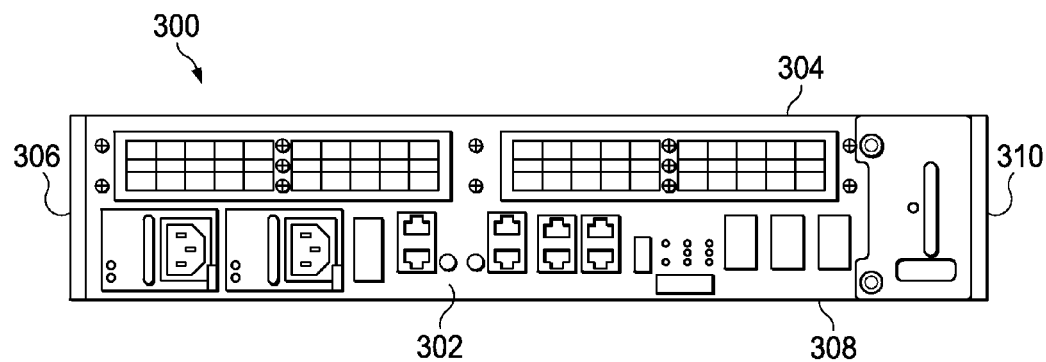
FIGS. 3A and 3B are simplified diagrams of an electronic device according to some embodiments of the present disclosure.
Figure 3B:
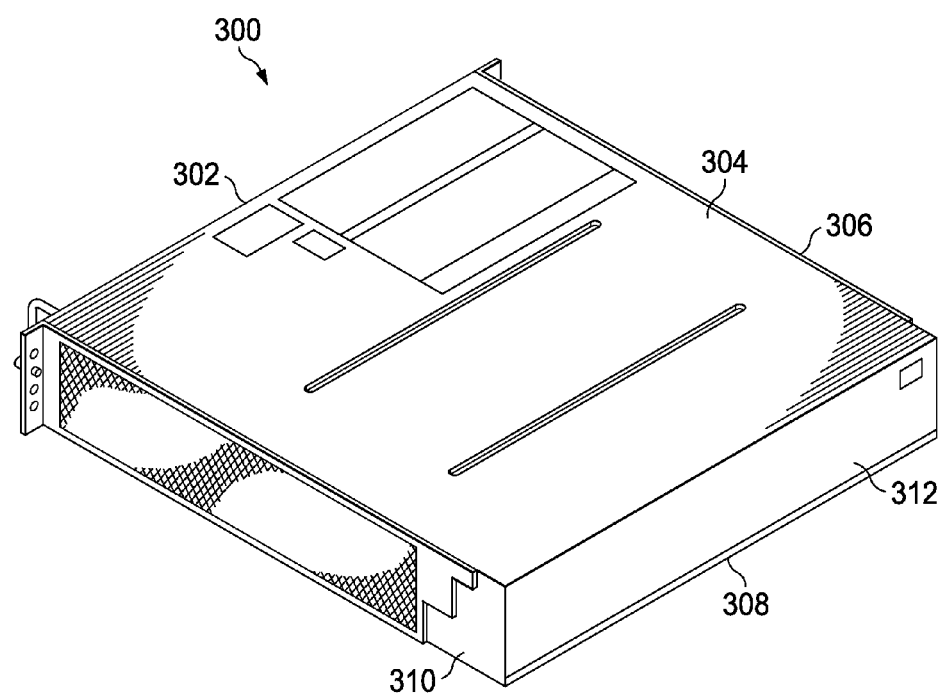

FIGS. 3A and 3B are simplified diagrams of an electronic device according to some embodiments of the present disclosure. In this example, the electronic device is a server 300. Throughout the present disclosure references is made to a server merely as an example of an electronic device. However, the present disclosure is not limited to such an implementation. The teachings of the present disclosure are equally applicable to a server, a router, a switch, a hard disk, a solid-state drive, or any other electronic device. An outer housing (e.g., exterior surfaces) of the server includes a front surface 302, a top surface 304, a (first) side surface 306, a bottom surface 308, a (second) side surface 310, and a back surface 312. The exterior surfaces of the server 300 include perforated surfaces (e.g., a first subset of exterior surfaces) and solid surfaces (e.g., a second subset of exterior surfaces). The perforated surfaces are inclusive of surfaces that include openings through which to allow wires, cables, exhaust air, air intakes, etc. to pass into and/or out of the server. For example, the perforated surfaces may include surfaces through which air is exchanged between an exterior and an interior of the electronic device. The solid surfaces are inclusive of surfaces that substantially prevent wires, cables, exhaust air, air intakes, etc. from passing into and/or out of the server. For example, the solid surfaces may include surfaces that substantially prevent air from being exchanged between the exterior and the interior of the electronic device. The front surface 302 is a perforated surface that includes a plurality of openings through which ports and receptacles protrude. The second side surface 310 includes a perforated portion and a solid portion. The perforated portion of surface 310 that includes a mesh grill through which air is received from the exterior to the interior of the server 300 for cooling the internal electronic components of server 300. Air is drawn into the mesh grill in surface 310 and is expelled (e.g., by exhaust fans) through openings in the side surface 306. Thus, the side surface 306 is a perforated surface through which air is expelled from the interior to the exterior of the server 300. Each of the top surface 304, the bottom surface 308, and the back surface 312 is a solid surface and, therefore, are substantially free of openings.

Figure 4:
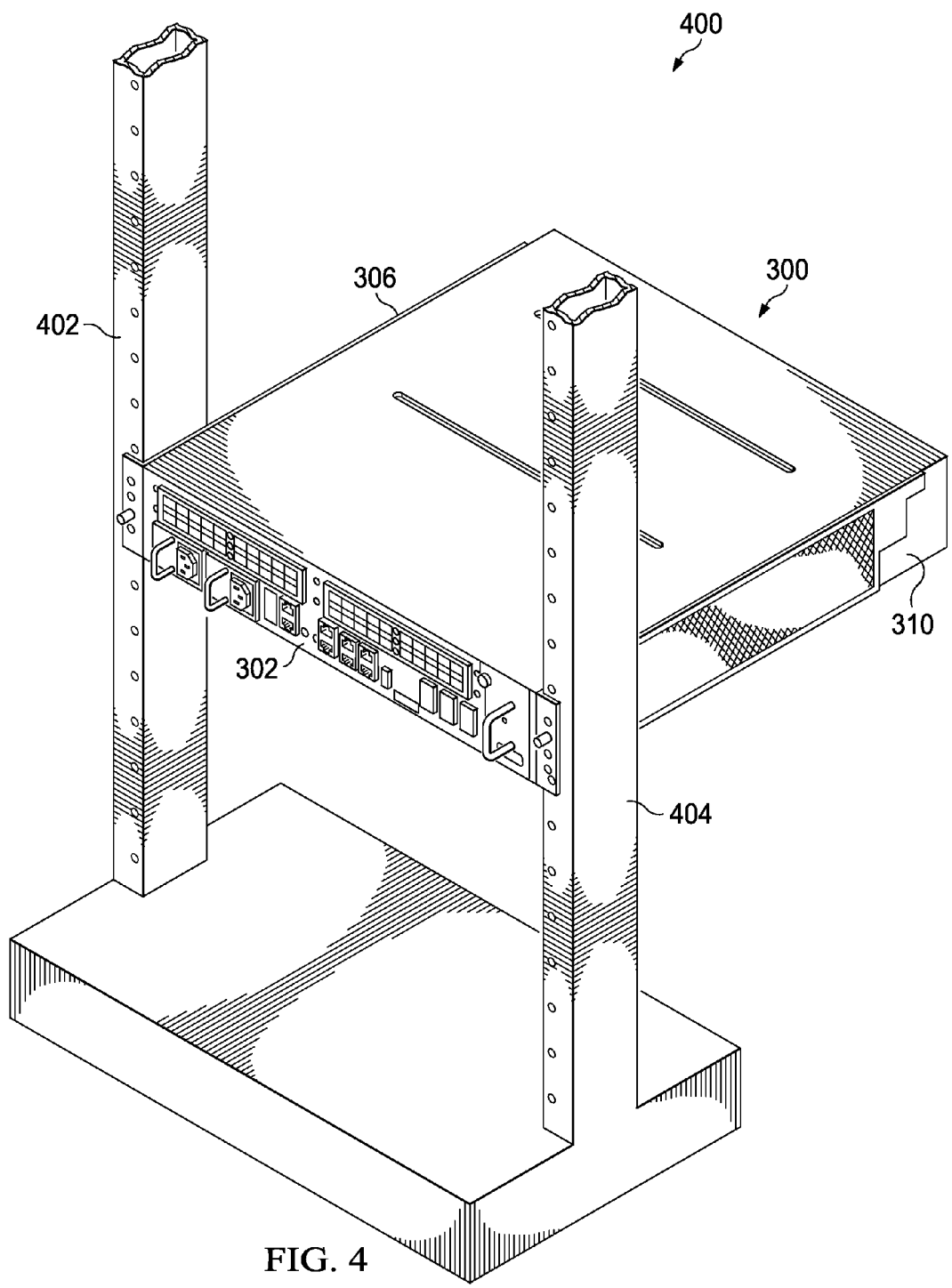
FIG. 4 is an isometric view of the electronic device coupled to the exemplary system for storing electronic devices according to some embodiments of the present disclosure.

FIG. 4 is an isometric view of the electronic device 300 coupled to the exemplary system for storing electronic devices according to some embodiments of the present disclosure. Server 300 is coupled to device support 402 and device support 404. Device supports 402 and 404 may correspond to device supports 204a and 204b, respectively, in rack 200. Mechanical fasteners attach the sides of server 300 to the device supports. In this case, the mechanical fasteners are screws that attached the server 300 to the device supports 402 and 404. In particular, a screw is connected through support 404 to a flange, which is coupled to the (second) side surface 310. Likewise, a screw is connected through support 402 to a flange, which is coupled to the (first) side surface 306. Although FIG. 4 only illustrates a single server, the device supports 402 and 404 may support a plurality of electronic devices. When there are multiple devices connected to the device supports, each of the devices may be connected in close proximity to one another. In some cases, the devices may physically contact one another (e.g., a top of one device contacts a bottom of another device). In other cases, the devices may have space between them (e.g., several millimeters of space, an inch or more of space, etc.).

An electronic device has a set of operating conditions in which it can properly operate (e.g., based on a manufacturer's recommendation and/or testing). The set of environmental conditions may be a value (or range of values) of environmental conditions. The broad concept of an environmental condition may include, e.g., thermal radiation, fire resistance, airflow, electromagnetic radiation (e.g., waves), temperature, moisture level, an amount of turbulence, a magnitude of velocity of an airflow, an amount of change in velocity, an amount of change (e.g., between in two points in time) in a velocity at a point within an airflow, an amount of variation in pressure between two or more points within an airflow, and/or an amount of impact load (e.g., from a projectile). In some examples, a range of operating temperatures of a device may be 41 to 104 degrees Fahrenheit (° F.), or 32 to 112° F. Excessively hot or cold temperatures may negatively impact the device's ability to function and/or cause failure of the device. An excessive temperature can be a temperature that is outside of a range of operating temperatures, outside of a manufacturer's recommended range of operating temperatures, a temperature less than or equal to 40° F., a temperature less than or equal to 31° F., a temperature greater than or equal to 105° F., a temperature greater than or equal to 105° F., and/or exposure to a fire. Similarly, operating conditions of an electronic device may include a fire rating for the device (e.g., an amount of time the device may be exposed to fire before failure) and/or a rating for Electromagnetic radiation (EMR) (e.g., a magnitude of Electromagnetic [EM] waves at a frequency or in a range of frequencies).

Electronic devices in a data center may be subjected to environmental conditions that are more extreme than those experienced by other electronic devices. As an example, a personal computer typically operates in an environment that is comfortable to a human (e.g., ambient temperatures such as 65° F. to 80° F.). In contrast, servers may operate in temperatures that commonly reach and or exceed 90° F. In addition, close proximity to other electronic devices (which themselves produce heat) further exacerbates the problem of controlling a temperature of a device and further adds to the harshness of the environment in which the device may operate.

Turning to FIG. 5, FIG. 5 illustrates an exemplary storage location 500. Storage locations may contain a plurality of storage systems, each of which may contain a plurality of electronic devices. Storage location 500 includes racks (also referred to herein as "cabinets") 502a and 502b, servers 504a-l, air plenum 508, raised floor cavity 506. Each of racks 502a and 502b may be a similar to rack 200 as described with respect to FIG. 2 and may support each of the servers 504 as described with respect to FIG. 4. Each of racks 502a and 502b rest upon a floor surface above the raised floor cavity 506. In addition, each of racks 502a and 502b are coupled to the air plenum 508 by corresponding chimneys at a top portion of each rack. Rack 502a stores servers 504a-f in an internal cavity. Rack 502b stores servers 504g-l in an internal cavity. Raised floor cavity 506 may be utilized to provide a number of services to the data center. For example, the raised floor cavity 506 provides cool air to the racks to help control the temperature of the servers stored therein. In this example, cool air is provided in an area proximate the front face of each of racks 502a and 502b. The cool air is drawn through each of the racks, channeled both through and around servers 504a-l, and expelled from the racks through the chimneys to plenum 508. For example, an exemplary airflow is described below:

1) An airflow is received in a front of a rack (e.g., the airflow moves through the front of the rack and, thereby, enters a cavity within the rack);
2) The airflow is received at a front of a server (e.g., and may continue to move around the server);
3) The airflow may be separated into a plurality of portions (e.g., based on turbulence and/or surfaces of the server):
   a first portion of the airflow is received at an opening in the front of the server to move through an internal cavity in the server (e.g., to cool electronic components therein, heating the air due to heat transfer from the electronic components to the air to cool electronic components),
   a second portion of the airflow is received at a substantially solid portion of the front of the server, the second portion may pass around the server (e.g., in a space between adjacent servers);
4) The plurality of portions of the airflow may join:
   the first portion of the airflow is received at a back face of the server,
   the second portion of the airflow is expelled from an opening at the back face of the server,
   the first portion and the second portion may combine at the back face of the server;
5) The combined airflow may vent (e.g., from the back face of the server) into a rear portion of the rack; the combined airflow may hit a solid back wall of the rack (e.g., and reflect in many directions, in a chaotic fashion, with an upward tendency due to the air being hot and therefore light, etc.);
6) The rack fills with air and, thereby, becomes pressurized; the pressurization forces the air to go out of an opening in the top of the rack (and perhaps other openings).

Figure 6A:
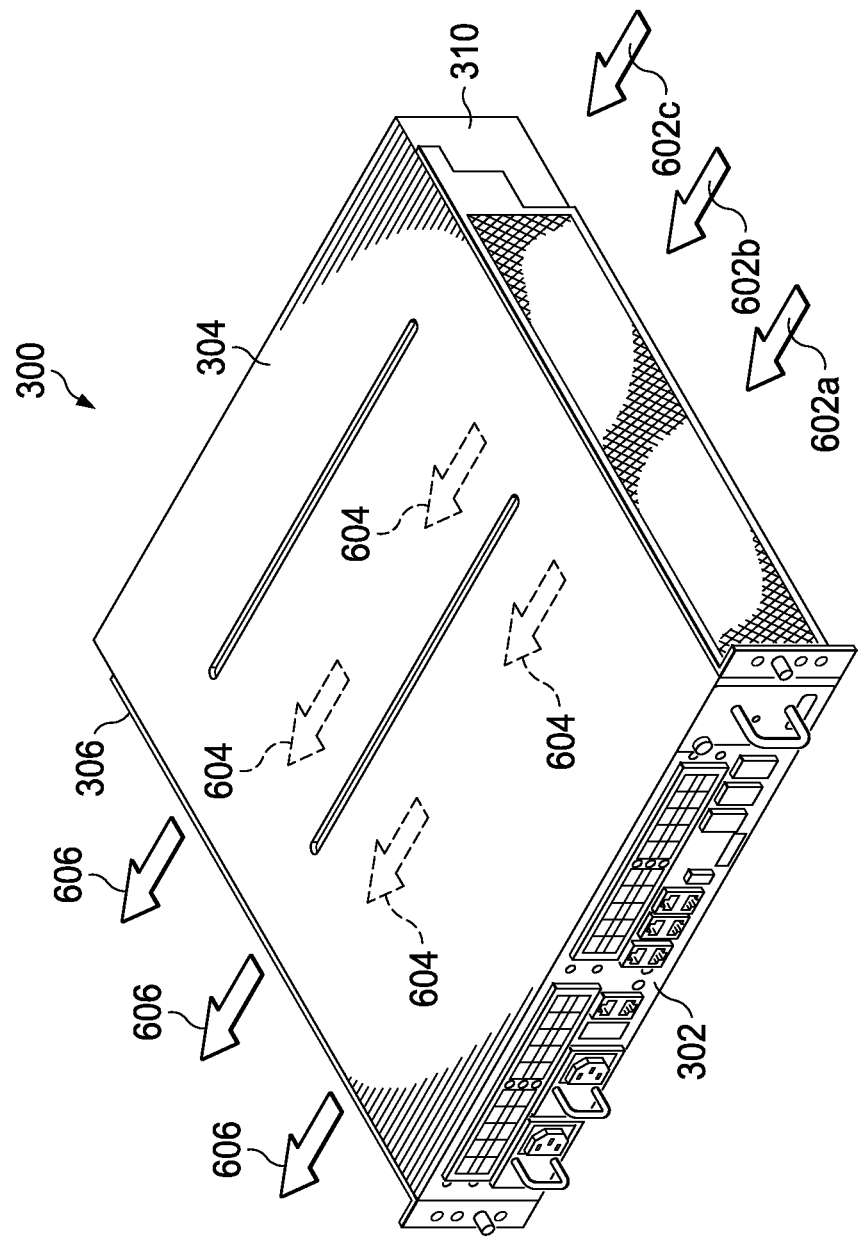
FIGS. 6A and 6B are simplified diagrams of an airflow proximate an electronic device.
Figure 6B:
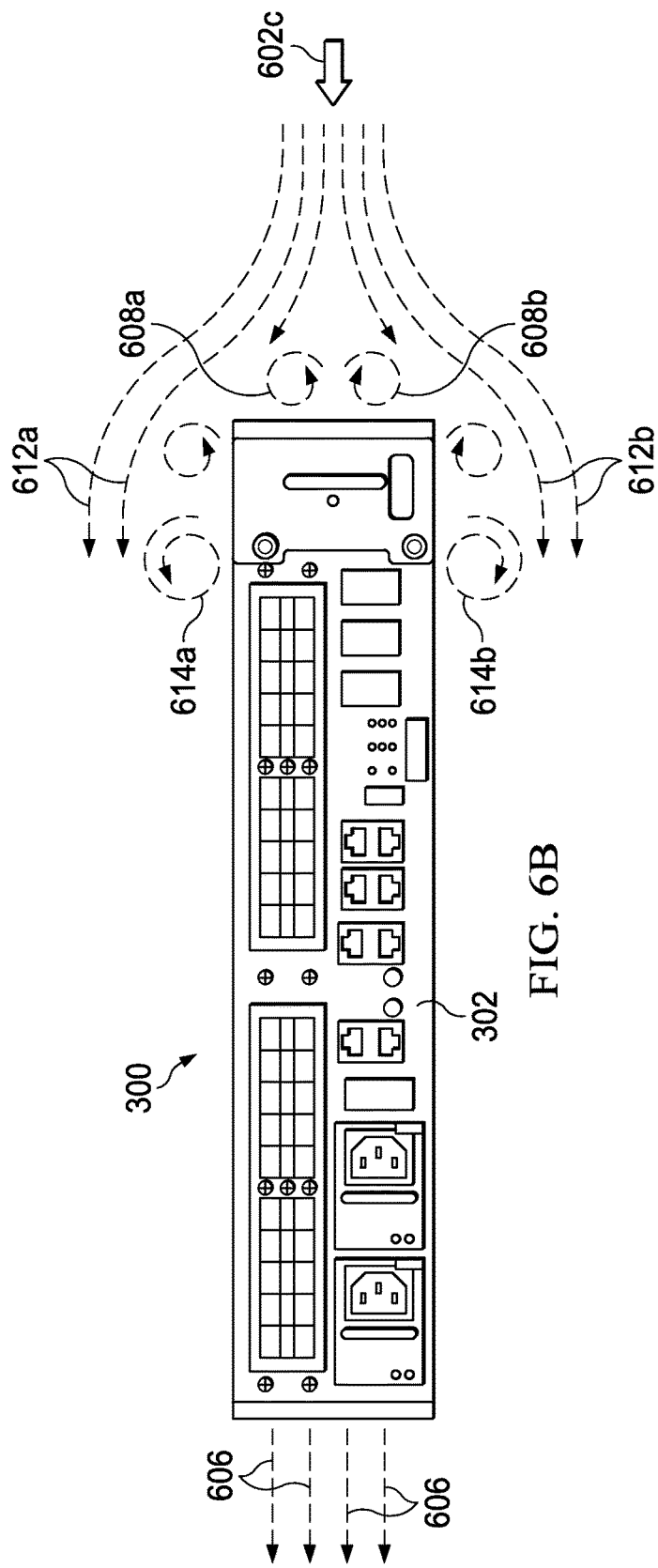

Some traditional systems cause turbulence in airflows proximate an electronic device. FIGS. 6A and 6B are simplified diagrams of an airflow proximate an electronic device. The airflow illustrated in FIGS. 6A and 6B (i.e., 602, 604, 606, 608, 612, and 614) correspond to 2, 3, and 4 in the exemplary airflow described above. Turning to FIG. 6A, FIG. 6A shows an exemplary airflow and its interactions with the server 300. The server includes the components as described with respect to FIGS. 3A, 3B, and 4 and, therefore, the details are not repeated only for the sake of brevity. Airflow 602 includes portions 602a, 602b, and 602c. The portions are received at a side surface 310 of the server. The airflow portions 602a and 602b reaches a perforated portion of the surface 310 (e.g., a mesh grille). The airflow portions 602a and 602b pass through the perforated portion, move through an internal cavity of the server, and pass over the electronic components therein (as indicated by airflow portion 604, pass through the internal cavity of the server). Heat transfers from the electronic components to the air and, thereby, cools the electronic components (and heats the air). After passing over the electronics, the airflow is expelled from the side of the server (as indicated by airflows 606). An active fan may draw the airflow through the server to propel the airflow out of perforated surface 306 of the server.

Airflow portion 602c reaches a relatively solid portion of surface 310. Turning to FIG. 6B, FIG. 6B shows the airflow portion 602c and its interactions with the server 300. In this case, when the airflow portion 602c hits the face 310, it reflects back into the airflow (i.e. in the opposite direction of the airflow), thereby, causing turbulence 608a and 608b. In addition, such turbulence is caused, at least in part, because movement of the reflected air is opposed by movement of the airflow and causes an area of lower pressure at the face 310 of the device. Some air rotates in the area of low pressure (as generally indicated by airflows 608a and 608b) and some air flows around the area of low pressure (as generally indicated by airflows 612a and 612b). The shapes of corners of the server 300 are relatively sharp (i.e., approximately 90 degree, square corners). Portions of the airflow 602c move over the corners and create areas of negative pressure proximate the corner and, thereby, cause turbulence 614a and 614b. Such turbulence (e.g., at faces and corners) disturbs the airflow around a device (and/or between devices) and reduces the cooling efficiency of air-cooling systems. For example, the turbulence may reduce the speed of the airflow and/or introduce secondary turbulence (i.e., based on interactions between two or more turbulent areas). The shape of an electronic device may cause and/or contribute to turbulence in an airflow (or portions therein) around the device.

Traditional storage systems may contribute to poor airflow and increase temperatures of electronic devices stored therein. A challenge regarding data centers is to efficiently move cool air through and around the data center equipment. In traditional systems, heat generated by an electronic device inside a storage device (e.g., servers in a server cabinet) radiates through the chassis and, thereby, spreads heat contamination both throughout the storage device (i.e., a cavity in the chassis) and from the storage device to the environment in which the storage device is located (e.g., a server room). Some traditional systems provide sound insulation (i.e., device to attenuate sound). However, traditional storage systems often lack any thermal insulation and, therefore, radiate waste heat into the environment and into other devices. Such radiation of heat decreases cooling efficiency of the room and of other (nearby) server cabinets. Some traditional storage devices utilize cooling systems (e.g., water- or air-cooling systems). However, even with such cooling in place, traditional server cabinets still radiate heat both back into the environment and into any adjacent cabinets, thereby, reducing cooling efficiency.

Figure 7A:
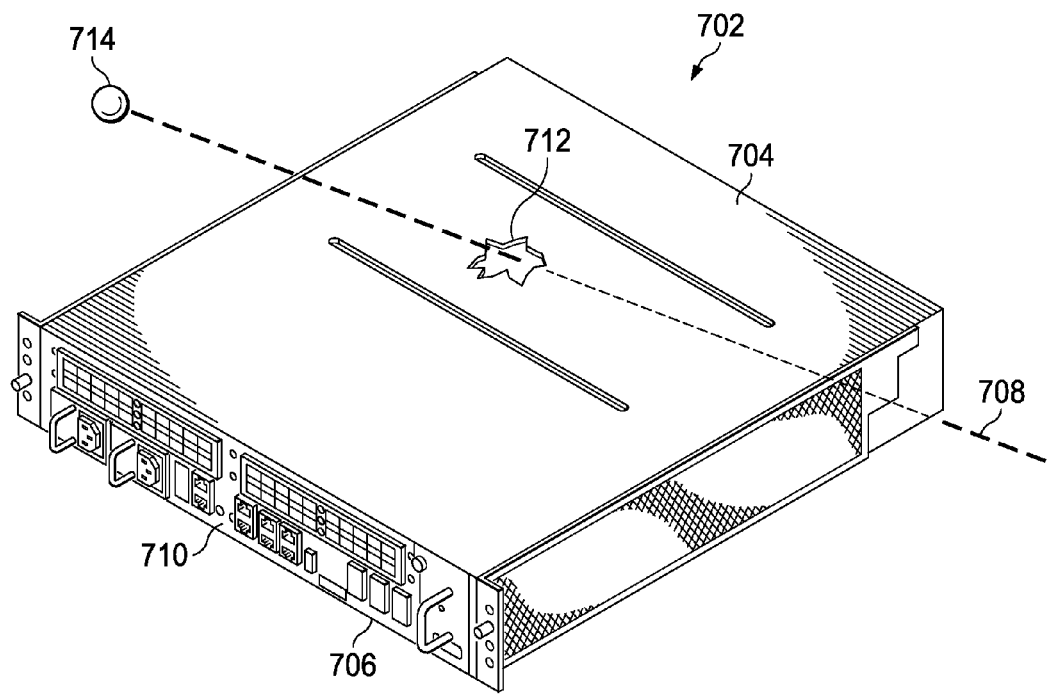
FIGS. 7A and 7B illustrate results of a projectile impacting an electronic device.
Figure 7B:
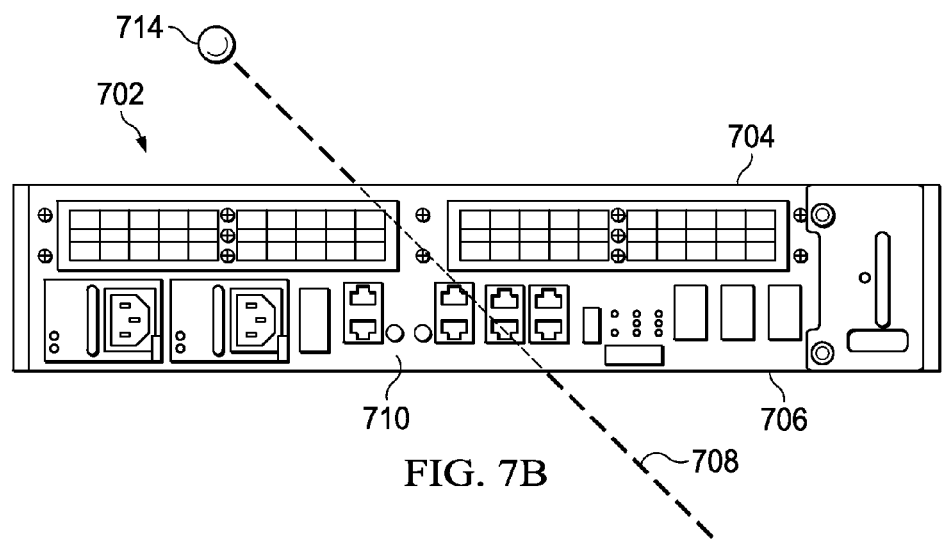

In addition, some traditional systems fail to address issues related to projectiles. In some cases, traditional data centers are located in areas subject to risk of intentional tampering (e.g., areas affected by conflict, war, or sensitive governmental sites). The electronic devices stored in such data centers are exposed to many potential sources of physical damage (e.g., projectiles, bullets, shrapnel, and/or extreme temperatures). While some data centers may have an armored exterior (e.g., thick walls or built underground), such armor offers the individual electronic devices little protection against a potential source of damage exists inside the data center. Consequently, these traditional data centers fail to protect individual electronic devices from many, potentially serious, sources of damage. As an example of the issues related to projectiles in traditional systems, FIGS. 7A and 7B illustrate results of a projectile impacting an electronic device 702. Projectiles can cause catastrophic damage to electronic devices. The damage can include rupturing an exterior housing of the electronic device and/or damaging internal electrical components within the electronic device. FIG. 7A is an isometric view of the electronic device 702. FIG. 7B is a view of a front face (i.e., surface 710) of the electronic device 702. The electronic device 702 may include the components as described with respect to FIGS. 3A, 3B, and 4 and, therefore, the details are not repeated only for the sake of brevity. In this example, projectile 714 damaged electronic device 702. Projectile 714 may be a bullet, shrapnel from an explosion, or any other high velocity object. Data centers in war-stricken areas may be under constant threat of such projectiles. However, data centers in non-war areas may also experience projectiles. For example, an explosion due to a gas leak can launch projectiles throughout a data center and, thus, can potentially cause damage to the electronic equipment stored therein. In this example, projectile 714 moved along flight path 708 in a direction from the bottom surface 706 toward the top surface 704. The projectile 714 ruptured the bottom surface 706 (the rupture is not shown). In addition, the projectile 714 ruptured the top surface 704 (thereby creating opening 712). The opening 712 is due to yielding and rupturing of a metal top surface when struck by the projectile. Projectiles may damage both exterior and interior components of an electronic device. While FIGS. 7A and 7B only illustrate the exterior of the electronic device 702, the internal components may be damaged by projectile 714. Impact from projectiles or any other high velocity objects may breach the housing of the server causing damage and/or failure of the electronic components therein. As illustrated by the examples of airflow and projectiles above, the environment of a data center (e.g., storing electronic devices such as a server, a router, a switch, a hard disk, a solid-state drive, and the like) may be distinct from that of other devices such as personal computers based, at least in part, on the extremity of the environment.

To address the above issues (and others), an electronic device may be wrapped with an apparatus to shield it from projectiles (e.g., a projectile-resistant apparatus). The projectile-resistant apparatus can wrap an individual electronic device and, thereby, provide protection from potential sources of damage that exist nearby the device (e.g., inside a data center). In some particular examples, the apparatus is a jacket or a shell. For example, a jacket may have an outer surface made of fabric (flexible); a shell may have an outer surface made of a rigid material (substantially non-flexible). The apparatus may include one or more panels. Each of the one or more panels includes one or more layers. Such an apparatus may be applied to an electronic device and/or to a device for storing such electronic devices to: (1) shield a projectile from contacting the electronic device; (2) dissipate kinetic energy of a projectile; (3) stop a projectile and/or prevent the projectile from passing through the apparatus (4) shield heat radiation, from another device, from contacting (or otherwise reaching) the electronic device; (5) shield heat radiation, generated by the electronic device, from reaching another electronic device; (6) shield a fire from (directly) burning the electronic device; (7) shield one or more electromagnetic waves, generated by another electronic device, from reaching the electronic device; (8) shield one or more electromagnetic waves, generated by the electronic device, from reaching another electronic device; and/or (9) facilitate a laminar airflow around the electronic device and/or around the apparatus (e.g., based on a shape of the apparatus). In some implementations, the apparatus may include only one of the forgoing features or any combination of individual features. The term "shielding" (i.e., to "shield"), as referred to herein, can include (among other things) protecting, shielding, redirecting, deflecting, absorbing, dissipating, enveloping, containing, stopping and/or otherwise controlling a projectile (and/or environmental conditions).

Each of the one or more layers of the one or more panels may be to provide shielding with respect to an environmental condition and/or a projectile. What follows is a description of several (non-limiting) examples of layers.

A projectile-resistant layer can shield an electronic device with respect to a projectile (i.e., an environmental condition). Thus, a projectile-resistant panel is a panel that includes one or more projectile-resistant layer. The projectile resistant layer may prevent the projectile from damaging the device or limit damage to the device after an impact by the projectile (e.g., to enable the device to remain operable and/or to protect memory elements such that data on the device is recoverable). For example, when the projectile resistant layer is wrapped around an electronic device, the layer may receive a projectile and prevent the projectile from penetrating through the layer (e.g., prevent it from passing though from one side of the layer to an opposite side of the layer). Thus, the projectile resistant layer can protect the device from damage. In operation, the projectile resistant layer may receive (e.g., be acted upon by), at an outer side of the layer, a projectile (e.g. moving at a given velocity). The projectile resistant layer protects the device, with respect to the received projectile, by dissipating kinetic energy through a thickness of the layer (e.g., thereby lowering the velocity and/or stopping the projectile (0 meters/sec)). Based on the energy dissipation, the outer side (and/or an inner side) of the layer may deform to absorb an impact of the projectile. The layer may not impart damage (or impart only minimal damage) to the electronic device. Correspondingly, a projectile-resistant panel may receive a projectile at an outer surface (e.g., where a projectile-resistant layer is an outermost layer of the panel) and dissipate kinetic energy of the projectile through a thickness of the panel (e.g., through the thickness of the projectile-resistant layer) and, thereby, stop the projectile and/or prevent the projectile the projectile from reaching an electronic device located proximate an inner surface of the panel. In some examples, the panel reduces the velocity of the projectile to 0 meters/sec (even if only temporarily, e.g., the projectile comes to rest before dropping from or being ejected from the panel). A projectile-resistant layer may comprise a projectile-resistant material including (but not limited to): projectile-resistant ceramic (e.g., boron carbide), projectile-resistant metal (e.g., steel, aluminum, metal alloys, etc.), projectile-resistant nanomaterial (e.g., carbon nanotube, Nano composites), projectile-resistant synthetic materials (e.g., aramid fiber and/or aramid plate, ultra high molecular weight polyethylene (UHMWPE) fiber and/or UHMWPE plate), a ballistic panel, and/or a high strength material. Each of the projectile-resistant materials includes a common property of being projectile-resistant. Materials and/or panels may be rated in one of a plurality of types defined by The National Institute of Justice's (NIJ) Standard-0101.06 titled BALLISTIC RESISTANCE OF BODY ARMOR (referred to herein as "NIJ Standard-0101.06"), which is hereby incorporated by reference its entirety. For example, a ballistic panel, as defined herein, is inclusive of a panel that successfully achieves a rating of one or more of type IIA, type II, type IIIA, type III, and/or type IV, as defined in the NIJ Standard-0101.06. In some examples, each of the projectile-resistant materials includes a common property of being included in a ballistic panel that successfully achieves any of the aforementioned ratings as defined in the NIJ Standard-0101.06.

A thermally resistant layer can shield an electronic device with respect to heat (i.e., an environmental condition). The thermally resistant layer may prevent waste heat from radiating into an environment (and into other devices) in which the device is located (e.g., a data center). For example, when a thermally resistant layer is wrapped around an electronic device, the layer may retain heat energy produced by the electronic device and prevent the heat energy from penetrating the layer and/or escaping into the air around the layer. Thus, the thermally resistant layer can insulate the device and, thereby, prevent heat escaping. As a result of the insulating effect of the thermally resistant layer, an exterior temperature of the layer may be lower than an internal temperature of the layer. In operation, the thermally resistant layer may receive, on an inner side of the layer, a hot airflow (e.g., 100° F. or higher). The thermally resistant layer insulates, with respect to the received heat, by dissipating heat energy in the hot airflow through a thickness of the layer. Based on the energy dissipation, an outer side of the layer may not transmit the heat energy to proximate objects (such as other layers, other devices, etc.). The thermally resistant layer may shield heat radiation, generated by another device, from contacting (or otherwise reaching) the electronic device (e.g., when wrapped around the electronic device. In this case, since the thermally resistant layer is protecting an electronic device that is wrapped therein, the heat is received on an outer side of the thermally resistant layer. Thus, the thermally resistant layer may receive a hot airflow on an outer side of the layer, and the layer insulates the internal electronic device from receiving the external heat radiation (i.e., by dissipating heat energy from the hot air flow on the outer side of the layer). In other examples, the resistant layer may both prevent heat from radiating away from a wrapped electronic device, to the environment, and prevent external heat from reaching the wrapped electronic device. Exemplary thermally resistant materials include foam, gypsum board, spray foam, or any other composition that provides thermal insulation. In some cases the material is selected based on a measure of thermal resistance (e.g., an R-value of the material) and or an efficiency of the material in dissipating thermal energy (e.g., a material that reduce a temperature by 40%).

A fire resistant layer can shield an electronic device with respect to fire (i.e., an environmental condition). In operation, the fire resistant layer may be to protect the electronic device from burning in a fire. In some cases, the layer may protect the device from directly burning, however, the device may still experience a temperature above an operating temperature of the device. As a result, some embodiments of the present disclosure use a fire resistant layer in combination with a separate (or integrated) thermally resistant layer. In some examples, the fire resistant layer receives a flame and/or a certain temperature (e.g., a temperature of 700° F. or higher) on an outer surface of the fire resistant layer and resists the fire (e.g., by burning slowly to protect an inner surface of the fire resistant layer). In further embodiments, when exposed to the fire (or to the certain temperature), a fire resistant material may change from one state to another state (e.g., from a (relatively) thin solid layer to a foam). The fire resistant layer may comprise a fire resistant material (i.e., a 'fireproof material'). Exemplary fire resistant materials include gypsum board, foamed ethylene tetrafluoroethylene (ETFE) (e.g., such as the ETFE sold under the trade name TEFZEL), foamed ethylene Chloro-TriFluoroEthylene (ECTFE) (e.g., such as the ECTFE sold under the trade name HALAR), a synthetic fiber, an aramid fiber (e.g., such as the aramid fiber sold under the trade name HALAR NOMEX), and/or any other composition that provides (1) thermal insulation and/or (2) resistance to extreme temperatures (such as those experienced in a fire). Fire resistant materials as disclosed herein may provide only (1), only (2), or both (1) and (2).

An electrically conductive layer can shield the electronic device with respect to electromagnetic (EM) radiation. The electrically conductive layer may retain electromagnetic signals inside the layer and, thereby, make electronic eavesdropping more difficult and reduce electromagnetic pollution in an environment in which the electrical device may be located (e.g., which could lead to wireless signal corruption). When the electrically conductive layer receives, at an inner surface of the layer, one or more electromagnetic waves (e.g., generated by the electronic device), it retains the one or more electromagnetic waves. For example, the electrically conductive layer may retain the electromagnetic waves by redirecting the one or more electromagnetic waves to a conductive energy sink and/or by distributing the waves over an enclosure defined (at least in part) by the layer (e.g., to providing a constant voltage on all surfaces of the enclosure, i.e., a faraday cage). Thus, the one or more electromagnetic waves are prevented (at least in part) from reaching another electronic device. In addition, an electrically conductive layer may prevent external electromagnetic signals from reaching an inner surface of the layer and, thereby, reduce the likelihood of electromagnetic pollution (e.g., in the environment in which the electrical device is located) from reaching the electronic device. When the electrically conductive material receives, at an outer surface of the layer, electromagnetic waves (e.g., generated by another device), it prevents the one or more electrically conductive waves from reaching an inner surface of the layer (and/or an electronic device wrapped therein). The mechanisms for preventing the signal from reaching the electronic device are similar to those described above for retaining electromagnetic waves and are not repeated here only for brevity. The electrically conductive layer may include grounding points, which are used to couple the layer to a current sink. In some embodiments, the electrically conductive layer may completely enclose an electronic device (e.g., to create a faraday cage around the device). The faraday cage may be grounded or ungrounded. When the faraday cage is grounded, the grounding points are coupled (e.g., by wires) to the current sink (e.g., to enable redirecting one or more electromagnetic waves to the current sink). When the faraday cage is ungrounded, the grounding points are not coupled to the current sink. The electrically conductive layer may enclose a device in its entirety or only in part. The electrically conductive layer may comprise an electrically conductive material. Exemplary electrically conductive materials may include a metal (e.g., gold, copper, silver, steel, metal alloy, etc.) or any electrically conductive material. An electrically conductive layer may be a continuous layer or a partial layer (e.g., perforated, mesh, grill, etc.). For example, a continuous may be a solid (e.g., unbroken) sheet of metal such as a metal foil or other planar implementation of the electrically conductive material layer. In other cases, a partial layer may include a conductive wire mesh, chicken wire, or any other planar conductive material with perforations therein. When the electrically conductive layer is a mesh, the mesh may have openings between individual wires in the mesh such that it is effective for blocking and/or shielding electromagnetic signals (e.g., openings are less than 1 inch, equal to about 1 mm, or less than or equal to 1 mm). Thus, the electrically conductive layer may be chicken wire (or similar) and/or a metal screen with a fine mesh. In some cases, the electrically conductive layer is embedded into another layer (e.g. insulation or fireproof layer). For example, a metal mesh may be embedded into fire resistant foam board and/or incorporated into a fabric (e.g., KEVLAR, NOMEX) jacket. In other examples, the electrically conductive layer may be embedded within a plurality of panels, where the electrically conductive layer is continuous through each of the plurality of panels, and when the apparatus wraps the electronic device, the electrically conductive layer defines a faraday cage around the electronic device. In such cases, thermal properties of the conductive material are selected based on material properties of the other layer (e.g., using steel wire based on it having a high enough melting point to match (or best match) a NOMEX fabric). The electrically conductive layer may be degaussed to eliminate any magnetization therein. After being degaussed (or otherwise demagnetized), other materials may be used to prevent an electrically conductive material from being magnetized over time (e.g., by EM waves or static emanating from the electronic device or from other devices). For example, carbon fiber reinforcement may be used adjacent to a metal wire mesh to control static electricity and reduce the likelihood of the static electricity increasing magnetization in the wire mesh.

Other layers, beyond the above exemplary layers, may be utilized in accordance with the systems and methods disclosed herein. Broadly speaking, any other layers may be utilized to shield from other environmental conditions and/or projectiles.

Each of the layers may be attached to an adjacent layer using one or more attachment mechanisms. An attachment mechanism may include an adhesive and/or a mechanical fastener. Exemplary adhesives include glue, resin, epoxy, or any other composition to bind two or more layers. For example, a wire mesh layer may be coupled to a ceramic layer using epoxy. The wire mesh may be laid upon a top surface of the ceramic layer. The epoxy may be applied to the mesh thereby embedding the wire mesh in a layer of epoxy where the wire mesh contacts the top surface of the ceramic layer (e.g., wherein the epoxy coats a top of the wire mesh, between individual wires of the wire mesh, and the top surface of the ceramic layer). The adhesive can be selected based on properties of the layers that it binds. For example, the epoxy in the above example may be a low-creep epoxy. Use of a low-creep epoxy may reduce the likelihood of the epoxy delaminating from the wire mesh under long-term stress. In other cases, the adhesive is selected based on the temperature at which it remains effective (e.g., selected such that it can withstand a typical temperature experienced in a data center (e.g., 100 degrees F.)). In other cases, noncorrosive adhesive is utilized (e.g., to reduce the likelihood of corroding of metal materials). A mechanical fastener is inclusive of a screw, a nut and bolt assembly, a clip, or any other mechanical fastener operable to couple two or more layers to one another.

Layers may be combined into panels and/or may be combined to create composite layers. Each of the above layers is discussed with respect to providing protection from a projectile (and/or an environmental condition). However, these layers may be combined into a panel or composite later that provides protection from more than one environmental condition (e.g., in addition to providing projectile protection). For example, a single layer may simultaneously provide shielding from, projectiles, heat, and electromagnetic radiation (e.g., using a metal wire mesh embedded in a ballistic panel). In such a case, the metal wire mesh may simultaneously define a Faraday cage and provide heat dissipation (e.g., by placing a portion of the metal wire mesh in a cool airflow thereby allowing heat to dissipate via the portion). Thus, the metal wire mesh may block incoming EM waves and transfer heat away from the wrapped electronic device by placing one of the edges into an airflow. Other layer combinations may be implemented without straying from the teachings of the present disclosure. Combinations of multiple layers that wrap the electronic device can advantageously increase cooling efficiency, lower utility costs, and increase data security.

A shape of one of the layers may shield the electronic device with respect to turbulence. For example, the shape may facilitate transforming the airflow from a turbulent regime to a laminar regime. A turbulent airflow may be received at one surface and is directed around a contour layer to another surface to a second face, thereby, reducing the turbulence of the flow and/or producing a laminar flow at the second face. Broadly speaking, the shape of an outer surface of a layer (or an apparatus including multiple layers as described herein) utilizes smooth contours (e.g., a gradual rate of change in a surface elevation, avoid right angles, and the like) to facilitate laminar airflows. The systems described herein also contemplate using relatively small surface variations (e.g., 1 mm ridges spaced several inches apart) on the surface of an outer layer to control airflow between elements by creating airflow channels.

In addition, a shape of each of the panels in the jacket 802 may conform to the shape of the exterior surface of the electronic device to which it corresponds. For example, a panel may include extrusions or recessions that correspond to (or match) any extrusions or recessions in the surface of the electronic device. Such extrusions or recessions in the panel enables the panel to fit over any extrusions or recessions in the surface of the electronic device and, thereby, remain proximate the surface of the electronic device even when the surface undulates. In some embodiments, each of the layers of a panel may conform to the shape of the exterior surface of the electronic device.

FIGS. 8A, 8B, 8C, 8D illustrate an exemplary system for shielding an electronic device according to an embodiment of the present disclosure. In this example, the system 800 comprises an electronic device 300 and an apparatus 802, which shields device 300. In this example, the apparatus 802 is a jacket that wraps at least a portion of the outer surfaces of the electronic device 300 to shield the electronic device from environmental conditions. In particular, the jacket includes a plurality of panels; each of the plurality of panels corresponds to an exterior surface of the electronic device 300. The plurality of panels is operable to shield the surfaces of the electronic device. In some cases, at least one of the plurality of panels is a projectile-resistant panel (e.g., comprising a projectile-resistant material). In other examples, each of the plurality of panels is a projectile-resistant panel (e.g., all are projectile-resistant). Each of the plurality of panels may contain one or more layers. For example, for each of the plurality of panels, at least one of the one or more layers comprises the projectile-resistant material. The jacket may also include at least one fabric sheet forming a plurality of pockets in which to receive the plurality of panels. Each of the plurality of pockets encloses at least one of the panels and facilitates the apparatus 802 wrapping the electronic device 300.

Figure 8A:
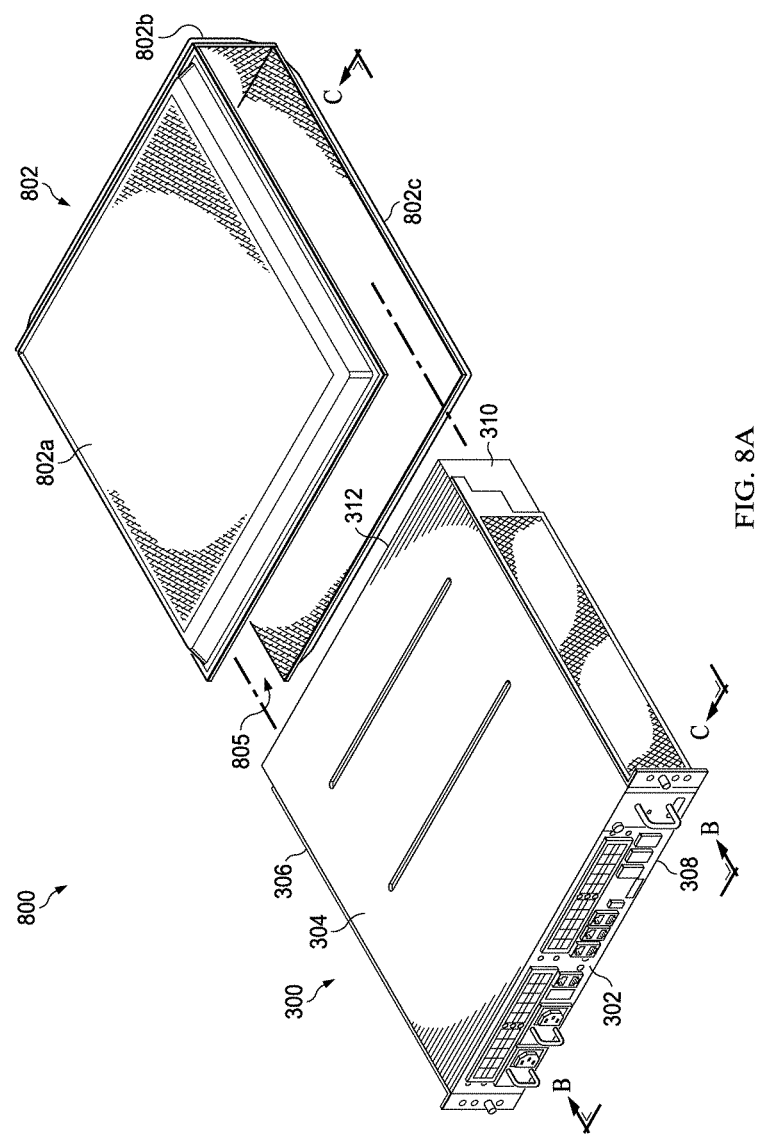

Turning to FIG. 8A, FIG. 8A illustrates an exploded isometric view of system 800. System 800 comprises server 300 and apparatus 802. The server 300 includes the components as described with respect to FIGS. 3A, 3B, and 4 and, therefore, the details are not repeated only for the sake of brevity. In this embodiment, apparatus 802 is a jacket that shields an electronic device (i.e., the server 300). The jacket 802 comprises upper portion 802a, side portion 802b, and lower portion 802c. Each of the portions 802a-c comprises at least one fabric sheet and at least one panel. Each of the portions 802a-c is adjacent to another of the portions 802a-c and is separated by an articulation in the jacket 802. The jacket is continuous across the portions 802a-c. The fabric sheets form pockets in which to receive the panels. For example, the fabric sheets may comprise a woven projectile-resistant material. In this example, each panel includes a projectile-resistant layer, which comprises, at least in part, a projectile resistant material. Each of portions 802a-c has an inner surface and an outer surface formed at least, in part by inner fabric sheets and outer fabric sheets. An inner surface of each of portions 802a-c defines a cavity 805 in which to receive an electronic device. The outer surface of each of portions 802a-c is the surface distal the cavity 805. An inner surface of the jacket 802 includes the inner surface of each of the portions 802a-c. The outer surface of the jacket 802 includes the outer surface of each of the portions 802a-c (e.g., also including the corners between the panels).

In operation, the jacket 802 receives the server 300 in the cavity 805. The inner surface of the jacket receives the server 300. The jacket shields the server 300 from projectiles (e.g., based on one or more layers comprised in a panel of the jacket, the shape of a panels, a fabric from which the jacket is constructed, a projectile resistant layer in a panel). In this example, when the jacket 802 wraps the server 300, each of the panels covers a solid surface of the exterior surfaces of the server 300 and does not cover a perforated surface of the exterior surfaces of the server 300. Thus, the jacket 802 wraps only a subset of the exterior surfaces of the server 300. As described above, the exterior surfaces of the server 300 include perforated surfaces (e.g., a first subset of exterior surfaces) and solid surfaces (e.g., a second subset of exterior surfaces). The first subset of exterior surfaces (i.e., the perforated surfaces) is inclusive of surfaces 310 (at least a portion of 310), 306, and 302, each of which includes openings through which to allow wires, cables, and/or air to pass into and/or out of the server 300. The second subset of exterior surfaces (i.e., the solid surfaces) is inclusive of surfaces 304, 308, and 312, each of which substantially prevents wires, cables, and/or air from passing into and/or out of the server 300. In this example, the portions of the jacket 802 wrap (or substantially cover) the second subset of exterior surfaces of the server 300 and do not wrap (do not cover) the second subset of exterior surfaces of the server 300. In particular, the upper portion 802a wraps surface 304; side portion 802b wraps back surface 312; lower portion 802c wraps bottom surface 308. The jacket 802 does not wrap the remaining sides (i.e., perforated sides 304, 308, and 312) of server 300 (e.g., to allow air to flow through the server and/or to allow access to receptacles and connectors).

In some embodiments, a jacket (according to the present disclosure) may protect any portion of an electrical device. In the above example, the jacket 802 wraps a subset of surfaces of the electronic device. In other implementations, the jacket 802 wraps all surfaces of the electronic device. In still other embodiments, the jacket may wrap all sides of the electronic device (e.g., completely enveloping the device). In further embodiments, jacket 802 completely encloses the electronic device with the exception of openings through which to allow wires, cables, exhaust air, air intakes, etc. to pass through the jacket. The selection of which surfaces of an electronic device to wrap (i.e., with an apparatus as disclosed herein) may be determined based on the device itself and/or the components therein. For example, jacket 802 only wraps the subset of surfaces of server 302 based on which surfaces do not require access (e.g., air access, or access by cables, wires, etc.).

Turning to FIGS. 8B and 8C, FIG. 8B shows a view of system 800 in a configuration where the jacket 802 wraps server 300, and FIG. 8C shows another view of system 800 where the jacket 802 wraps server 300. FIG. 8B is a view from the viewpoint arrows labeled "B" in FIG. 8A. FIG. 8C is a view from the viewpoint arrows labeled "C" in FIG. 8A. The jacket 802 comprises fabric sheets 804, 806a-c, 812, and 814, and panels 808, 810, and 816. Each of panels 808, 810, and 816 includes a projectile-resistant layer. In addition, each of the panels corresponds to an exterior surface of the server. For example, the panel 808 corresponds to the top surface 304 (i.e., a solid surface) of the server 300, the panel 810 corresponds to the back surface 312 (i.e., a solid surface) of the server 300, and the panel 816 corresponds to the bottom surface 308 (i.e., a solid surface) of the server 300. When the jacket 802 wraps the server 300, each of the panels covers the surface to which it corresponds. In this example, when the jacket 802 wraps the server 300, each of the panels covers a solid surface of the exterior surfaces of the electronic device and does not cover a perforated surface of the exterior surfaces of the electronic device. In particular, the panel 810 covers the top surface 304; panel 810 covers the back surface 312; and the panel 816 covers the bottom surface 308. The panels of the jacket 802 do not wrap the remaining sides (i.e., perforated sides 304, 308, and 312) of server 300 (e.g., to allow air to flow through the server and/or to allow access to receptacles and connectors). Each of the panels has a first size and a first shape that matches a second size and a second shape of the surface of the server 300 to which it corresponds. The jacket 802 is continuous across the inner surface 806, which includes inner fabric sheets 806a, 806b, and 806c. The inner surface 806 contacts at least a portion of the exterior surfaces of the server. In addition, the jacket 802 includes articulations located between a pair of adjacent pockets (or between adjacent portions). For example, the jacket has articulations at the intersection of portions 802a and 802b and at the intersection of portion 802b and 802c. The articulations facilitate wrapping and/or removing the jacket from the server 300. In particular, the articulations facilitate the jacket 802 wrapping (and/or removing the jacket from) the server 300 by enabling rotation, relative to one another and about the articulation, between a first panel located in a first pocket of the pair of adjacent pockets and a second panel located in a second pocket of the pair of adjacent pockets. In this example, the articulations are seams, which, in FIG. 8C, are folded at about a 90 degree angle about the corners of the server 300. The articulations facilitate wrapping the jacket around the server (e.g., by facilitating rotating a surface of each panel to an orientation that is substantially parallel with an outer surface of the server 300). For example, the upper portion 802a includes a first pocket, which is adjacent to a second pocket in the side portion 802b and separated by a first articulation. The panel 808 is located in the first pocket (in the upper portion 802a) and the panel 816 is located in the second pocket (in the side portion 802b). The panels 808 and 816 are operable to rotate relative to one another and about the first articulation. Similarly, the lower portion 802c includes a third pocket, which is adjacent to the second pocket in the side portion 802b and separated by a second articulation. The panel 810 is located in the third pocket (in the lower portion 802c) and the panel 816 is located in the second pocket (in the side portion 802b). The panels 810 and 816 are operable to rotate relative to one another and about the second articulation.

The fabric sheets form pockets in which to receive the panels. For example, upper portion 802a includes inner fabric sheet 806a, outer fabric sheet 804, and panel 808. The outer fabric sheet 804 and the inner fabric sheet 806a form a pocket in which to enclose the panel 808. The inner fabric sheet 806a and the outer fabric sheet 804 are attached to one another by an attachment mechanism, along an entire perimeter of the panel 808, to create the pocket. The attachment mechanism secures the inner fabric sheet 806a to the outer fabric sheet 804. The attachment mechanism defines, at least in part, a cavity (or pocket) between the inner fabric sheet 806a and the outer fabric sheet 804 in which to hold panel 808. Similarly, side portion 802b includes inner fabric sheet 806b, outer fabric sheet 814, and panel 816. The outer fabric sheet 814 and the inner fabric sheet 806b form a pocket in which to enclose the panel 816. The inner fabric sheet 806b and the outer fabric sheet 814 are attached to one another by an attachment mechanism, along an entire perimeter of the panel 816, to create the pocket. The attachment mechanism that secures the inner fabric sheet 806b to the outer fabric sheet 814. The attachment mechanism defines, at least in part, a cavity (or pocket) between the inner fabric sheet 806b and the outer fabric sheet 814 in which to hold panel 816. Likewise, lower portion 802c includes inner fabric sheet 806c, outer fabric sheet 812, and panel 810. The outer fabric sheet 812 and the inner fabric sheet 806c form a pocket in which to enclose the panel 810. The inner fabric sheet 806c and the outer fabric sheet 812 are attached to one another by an attachment mechanism, along an entire perimeter of the panel 810, to create the pocket. The attachment mechanism that secures the inner fabric sheet 806c to the outer fabric sheet 812. The attachment mechanism defines, at least in part, a cavity (or pocket) between the inner fabric sheet 806c and the outer fabric sheet 812 in which to hold panel 810. In some embodiments, the attachment mechanism between fabric sheets may include adhesive, stitching, or any other attachment mechanism. In a particular example, the attachment is stitching that extends the entire length of and is located proximate to each of four coplanar edges of a panel. As further example, the fabric sheets and stitching may be made of KEVLAR, NOMEX, or other high strength material, ballistic material, or projectile-resistant material.

Other variations on jacket 802 may be to include an electrically conductive layer (e.g., a metal, a wire mesh, or other electrically-conductive material) that wraps all surfaces of the server 300. In such an embodiment, a portion of the electrically conductive layer is embedded within the panels. For example, the electrically conductive layer may be enclosed within a layer of the jacket 802 (e.g., embedded in a fabric, or a layer of a panel, enclosed in portions 802a-c), while the other portions of the wire mesh are not enclosed with a layer of the jacket 802 (e.g., would cover front 302, side 310, and side 306). The electrically conductive layer may be continuous through each of the plurality of projectile-resistant panels. In such an example, when the apparatus wraps the electronic device, the electrically conductive layer defines a faraday cage around the electronic device (even when the panels 808, 816, and 810 only cover surface 304, 308, and 312 respectively). The electrically conductive layer can grounding points, which can be coupled to a current sink (e.g., to facilitate redirecting one or more electromagnetic waves to the current sink). Thus, some of the layers within the jacket may wrap all surfaces of the electronic device, while other layers wrap only a subset of the surfaces of the electronic device. In a particular example, each of panels covers one of the solid surfaces of the server 300 (e.g., one of a second subset of exterior surfaces) and not does not cover any of the perforated surfaces of the server 300 (e.g., a first subset of exterior surfaces) and the electrically conductive layer extends over all of the perforated surfaces (i.e., the first subset of exterior surfaces) and all of the perforated surfaces (i.e., the second subset of the exterior surfaces).

The outer surface of the jacket is contoured at its edges (i.e., a contours). The shape of the outer surface may shield the electronic device with respect to turbulence. The shape of the outer surface may be defined by the shape of the panel (or layers therein) and/or may be defined by each layer of the panels (e.g., each layer follows the same shape).

Figure 8D:
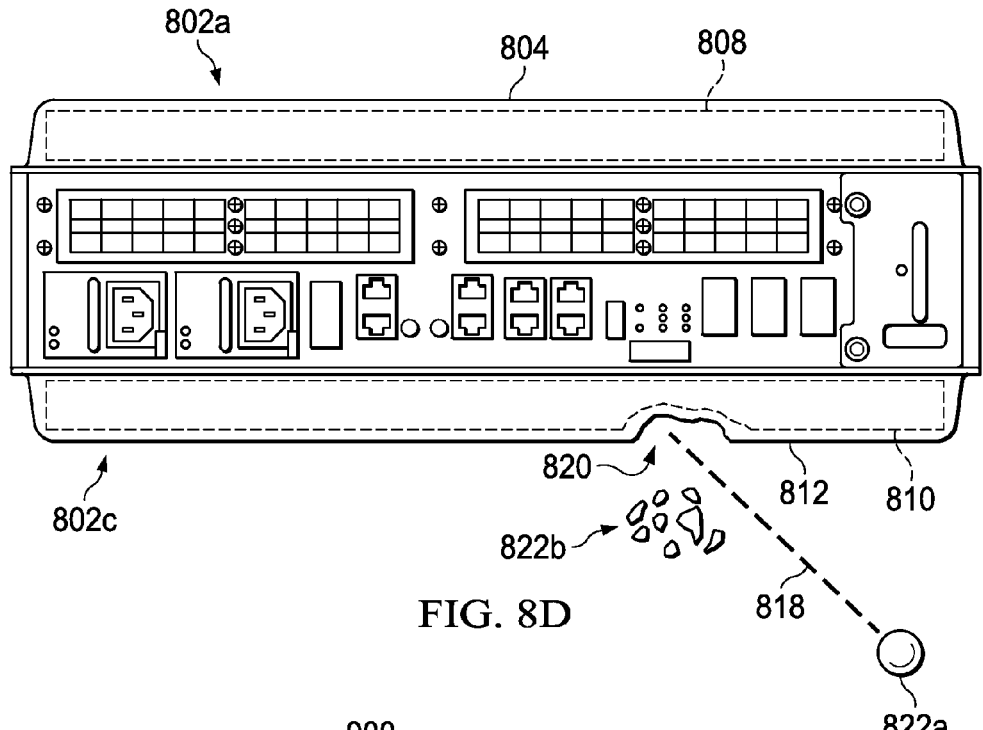

Turning to FIG. 8D, FIG. 8D shows the jacket 802 shields server 300 from a projectile. In this example, the projectile 822 impacts the jacket 802 at the lower portion 802c and, as a result of the impact, deforms the outer surface of the jacket. At a first point in time, the projectile is at a position distal to the apparatus as indicated by 822a and is moving at a first velocity. The projectile moves (e.g., at the first velocity) along flight path 818. At a second point in time (subsequent to the first point in time), the projectile impacts the apparatus 802 at impact area 820 of the lower portion 802c. Because the lower portion 802c is projectile resistant (e.g., based on the inclusion of one or more projectile resistant layers and/or projectile resistant materials), the lower portion 802c protects the server 300 from the projectile. The lower portion 802c receives the projectile on at panel 810 and outer fabric sheet 812. At the second point in time, the projectile moves at a second velocity (e.g., where the second velocity is less than the first velocity). The projectile resistant material in the panel 810 and outer fabric sheet 812 protects the server 300, with respect to the received projectile, by dissipating kinetic energy through a thickness of the layer and/or by deforming the fabric sheet (e.g., thereby lowering the velocity and/or stopping the projectile). For example, the second velocity may be 0 meters/second. Based on the energy dissipation, the outer surface of the panel deforms (e.g., as shown at impact area 820) to absorb an impact of the projectile. The deformation of the panel (and/or outer fabric sheet) may not impart damage to the electronic device. In some cases, the combination of the panel and fabric sheet deforms but does not rupture and, thereby, reduces the likelihood that the projectile will cause catastrophic damage to components internal to the server 300. At a third point in time, the projectile is deflected by the lower portion 802c and breaks apart at 822b. In contrast to systems that fail to protect electronic devices from projectiles (e.g., in FIG. 7A-B), the apparatuses (and methods) described herein can receive and deflect the projectile to protect the electronic device.

While the example of FIGS. 8A, 8B, 8C, 8D are discussed with respect to a single electronic device, the single electronic device may be located in a storage rack, which includes a plurality of other electronic devices (e.g., as described with respect to FIG. 5). An apparatus according to the present disclosure (e.g., a jacket of shell as disclosed herein such a jacket 802, or any variation of such an apparatus as disclosed herein) may wrap one or more of the plurality of other electronic devices. Each apparatus (that wraps any of the one or more of the plurality of other electronic devices) may include a plurality of panels. At least one of the plurality of panels is a projectile-resistant panel. Each of the plurality of panels covers one solid surface of the exterior surfaces of the electronic device and does not cover any perforated surface of the exterior surfaces of the electronic device. The storage rack may comprise a housing, which defines a space in which the plurality of other electronic devices are supported. In such cases, any projectile entering the rack must first pass through the housing and, therefore, the panels proximate the housing are more likely to be struck by such a projectile. Thus, in some embodiments, only panels that are located directly adjacent to the housing to are projectile-resistant (include projectile-resistant materials). Such a selective use of projectile-resistant panels may help to more efficiently use projectile-resistant panels than having all surfaces of all of the plurality of other electronic devices covered by plurality of other electronic devices. Turning back to FIG. 5, in such a selective use of projectile-resistant panels, only a front, back, and top surface of server 504a are covered with projectile-resistant panels and a bottom surface of the server 504a is not covered by a projectile-resistant panel (e.g., but may still be covered by any other layer or type of panel as disclosed herein). In addition, in such a selective use of projectile-resistant panels, only a front and back surface of server 504b are covered with projectile-resistant panels and a top and a bottom surface of the server 504a are not covered by a projectile-resistant panels. Moreover, the various panels placed in an apparatus need not contain the same layers or the same number of layers. For example, turning back to the FIGS. 8A-8D, the panels 808, 816, and 810 may not contain identical layers or numbers of layers (with respect to one another). Each of the panels may include layers that are selected for predominant environmental conditions to which it is exposed (which may result in the panels being different from one another).

Figure 9A:
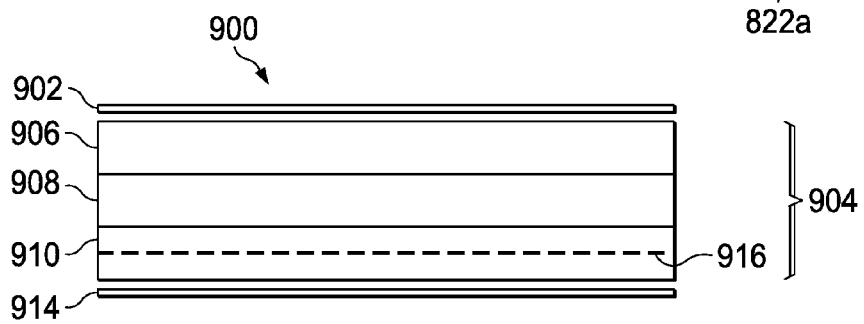
FIGS. 9A and 9B are exemplary cross sections of an apparatus according to some embodiments of the present disclosure.
Figure 9B:
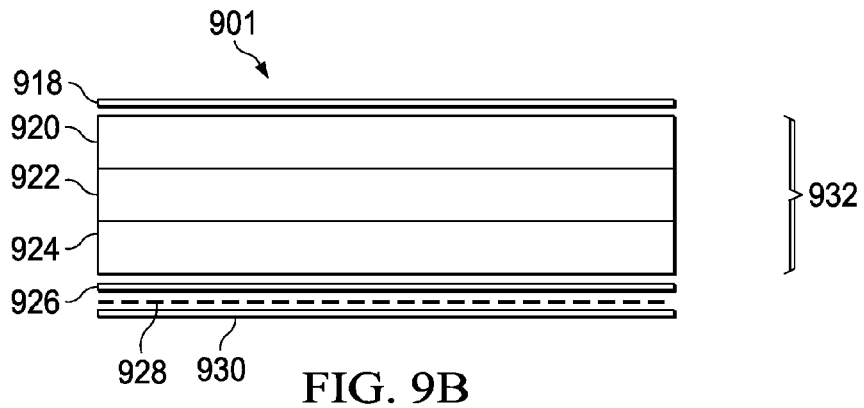

FIGS. 9A and 9B illustrate exemplary cross sections of an apparatus according to some embodiments of the present disclosure. The cross sections 900 and 901 are exemplary implementations of one or more panels (e.g., panels 808, 816, and 810) of the jacket 802 of FIGS. 8A-8D as cut along the section line labeled "D" in FIG. 8C.

Turning to FIG. 9A, FIG. 9A illustrates cross section 900, which includes fabric sheets 902 and 914, and panel 904. The panel 904 comprises a plurality of layers; each layer provides (e.g., for an electronic device wrapped by the panel) protection from a corresponding source of damage (e.g., an environmental condition and/or a projectile). In this example, the panel 904 includes four layers: a fire resistant layer 906, a projectile resistant layer 908, a thermally resistant layer 910, and an electrically conductive layer 916. The electrically conductive layer 916 is a conductive mesh, which is embedded within the thermally resistant layer 910. Each of the plurality of layers may be attached to an adjacent layer of the plurality of layers. In some examples, the panel 904 is constructed as follows: providing the thermally resistant layer 910 including the conductive mesh 916 therein, adding the projectile resistant layer 908 on top of the thermally resistant layer 910, adding the fire resistant layer 906 on top of the projectile resistant layer 908. The adding may include attaching with an adhesive or mechanical fastener. In other examples, the adding may be stacking each panel on the last panel and attaching them with a single attachment mechanism (e.g., a mechanical fastener (such as a screw or bolt) that extends through all of the layers, placing the layers in a confining wrap such as a pocket or bag, or adhesive that bonds the layer to one another). Fabric sheets 914 and 902 may be attached to one another to envelope panel 904 in a pocket (e.g., as described with respect to inner fabric sheet 806 (i.e., 806a-c) as illustrated in FIGS. 8A-8D).

In some embodiments, the jacket 802 of FIGS. 8A-8D includes the components of cross section 900 (e.g., cross section 900 corresponds to a cross section of jacket 802 as cut along the section line labeled "D" in FIG. 8C). In such an embodiment, the panel 904 of FIG. 9A may correspond to any one or more of panels 808, 816, and 810 of FIGS. 8A-8D. For example, the sheet 902 of FIG. 9A may correspond to outer fabric sheet 804 of FIGS. 8A-8D, sheet 914 of FIG. 9A may correspond to inner fabric sheet 806a of FIGS. 8A-8D, and panel 904 of FIG. 9A may correspond to panel 808 of FIGS. 8A-8D. The components of cross section may 901 correspond the other portions of the jacket 802 (e.g., side portion 802b and lower portion 802c) in a manner similar to that described for the upper portion 802a. In other embodiments, the cross section 900 may also be utilized in jackets 1100 and/or 1200 (which will be described in further detail below).

Turning to FIG. 9B, FIG. 9B illustrates cross section 901, which includes fabric sheets 918, 926, and 930, and panel 932. Panel 932 includes three layers: a projectile resistant layer 920, a fire resistant layer 922, and thermally resistant layer 924. In this example, the sheet 918 is an outer sheet; each of sheets 926 and 930 is an inner sheet. The inner sheets embed another material. In particular, the fabric sheets 926 and 930 embed an electrically conductive layer 928. In this case, the electrically conductive layer 928 is a metal mesh. The fabric sheets 926 and 930 are attached to one another to, at least in part, enclose the metal mesh 928. In some examples, the fabric sheets 926 and 930 are stitched together around the metal mesh 928. The metal mesh 928 may be utilized to create a faraday cage around an electronic device. Fabric sheet 918 may be attached to sheet 926 (and/or sheet 930) to create pocket in which to receive panel 932 (e.g., as described with respect to creating a pocket in which to receive the panels 808, 816, and 810 in FIGS. 8A-8D).

In some embodiments, the layers in cross sections 900 and/or 901 may conform to the shape of a surface (of an electronic device) to which it corresponds. For example, a layer may include extrusions or recessions that correspond to (or match) any extrusions or recessions in the surface of the electronic device. Such extrusions or recessions in the each layer enables a panel (in which the layer is located) to fit over any extrusions or recessions in the surface of the electronic device and, thereby, remain proximate the surface of the electronic device even when the surface undulates.

In some embodiments, the jacket 802 of FIGS. 8A-8D includes the components of cross section 901 (e.g., cross section 901 corresponds to a cross section of jacket 802 as cut along the section line labeled "D" in FIG. 8C). In such an embodiment, the panel 932 of FIG. 9B may correspond to any one or more of panels 808, 816, and 810 of FIGS. 8A-8D. In the example of the upper portion 802a of the jacket 802, the sheet 918 of FIG. 9B may correspond to outer fabric sheet 804 of FIGS. 8A-8D, sheets 926 and 930 (including mesh 926) of FIG. 9B may correspond to inner fabric sheet 806a of FIGS. 8A-8D, and panel 932 of FIG. 9B may correspond to panel 808 of FIGS. 8A-8D. The components of cross section may 901 correspond the other portions of the jacket 802 (e.g., side portion 802b and lower portion 802c) in a manner similar to that described for the upper portion 802a. In other embodiments, the cross section 900 may also be utilized in jackets 1100 and/or 1200 (which will be described in further detail below).

Figure 10:
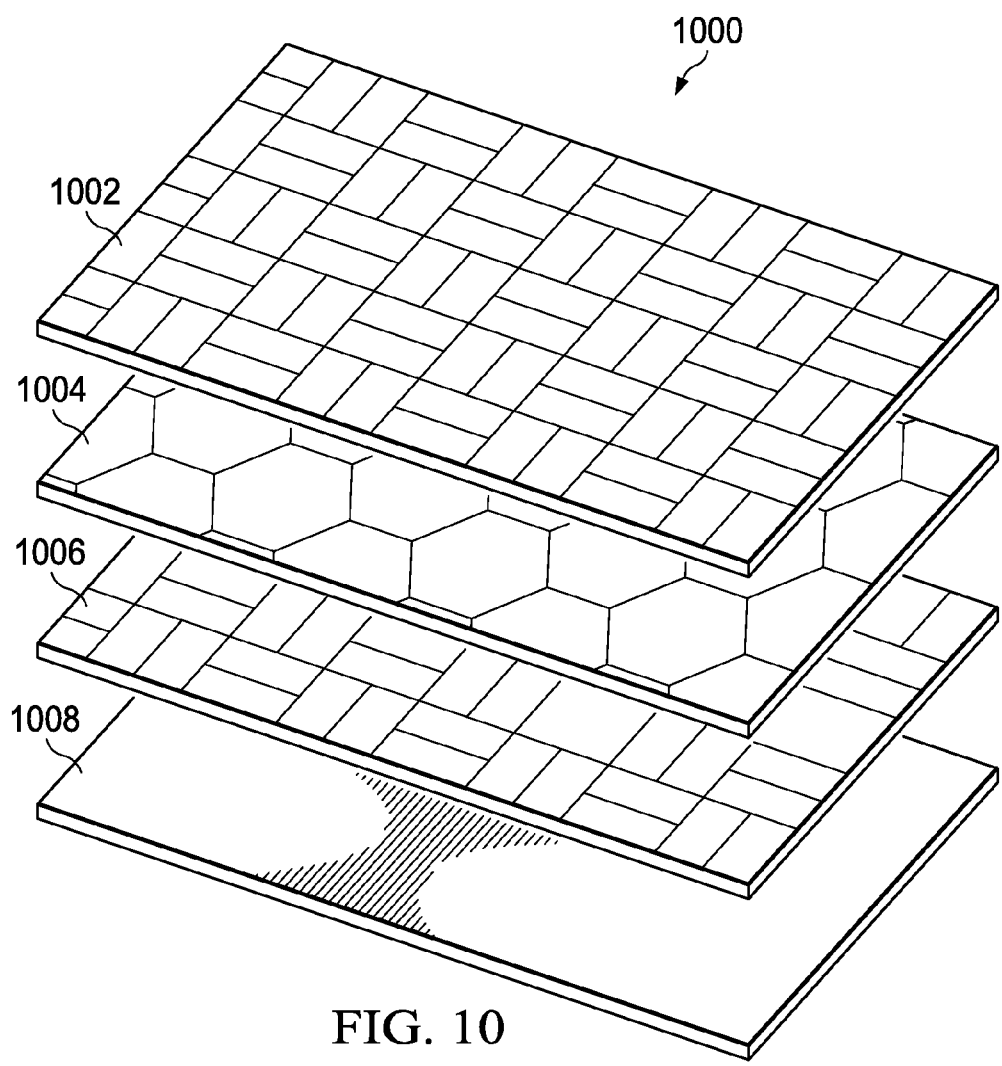
FIG. 10 illustrates exemplary layers of an apparatus according to some embodiments of the present disclosure.

In the examples of FIGS. 9A and 9B, the panels include three or four layers. However, the panels disclosed herein are not limited to such implementations. Each panel in an apparatus may include any combination of layers (e.g., including additional or fewer layers than shown in FIGS. 9A and 9B). For example, FIG. 10 illustrates other exemplary layers for a panel. System 1000 includes four layers, including two layers of projectile-resistant ceramic, a conductive mesh layer between the layers of projectile-resistant ceramic, and a fire resistant insulating material. In particular, system 1000 includes a first layer of projectile-resistant ceramic 1002, a conductive mesh layer 1004, and a second layer of projectile-resistant ceramic 1006, and a fire resistant layer 1008. In some embodiments, the conductive mesh layer includes grounding points for, e.g., grounding a faraday cage created (at least in part) by the conductive mesh layer. System 1000 may be constructed in a manner similar to that described with respect to FIGS. 9A and 9B. Other exemplary panels may include three layers of insulating foam, wherein wire mesh is located between the layers of insulating foam (e.g., where the layers are as follows: insulating foam, wire mesh, insulating foam, wire mesh, insulating foam). Still other exemplary panels may include three layers of gypsum board (e.g., ⅛th inch thick), and either a metal sheet or a metal mesh between the layers of gypsum board. Other examples may use any number or combination of layers.

Turning back to FIGS. 8A-8D, because the jacket 802 contains a continuous inner fabric sheet 806, the jacket is flexible and can be opened or closed to wrap around an electronic device (e.g., based on the articulations). The articulation facilitates the apparatus being removed from the electronic device by enabling panels in adjacent pockets to rotate relative to one another and about the articulation. In the above examples, the electronic device is a rectangular cube. However, an apparatus as disclosed herein (e.g. a jacket or a shell) can wrap devices having any shape. For example, an apparatus as disclosed herein may wrap an electronic device having any of the following (non-limiting) exemplary shapes: circular tubes, octagonal tubes, curved, compound curves, and/or any other linear or non-linear shape. In the examples of FIGS. 8A-8D, each portion (i.e., each of portions 802a-c) corresponds to a single, flat surface of the device. Jacket 802 has articulations at the intersection of portions 802a and 802b and at the intersection of portion 802b and 802c to facilitate wrapping and/or removing the jacket from the electronic device. The inner surface 806 (of jacket 802) wraps the outer surfaces of server 300 based on the articulations. In other examples, where the electronic device has a curved shape, a plurality of panels where articulations are located between adjacent panels to accommodate the panels moving about the device to lay against different portions of the curved shape. For example, the panels may be articulated around a single, curved surface or any other irregular geometry (e.g., small panels each stitched into corresponding small portions of a fabric sheet).

Figure 11:
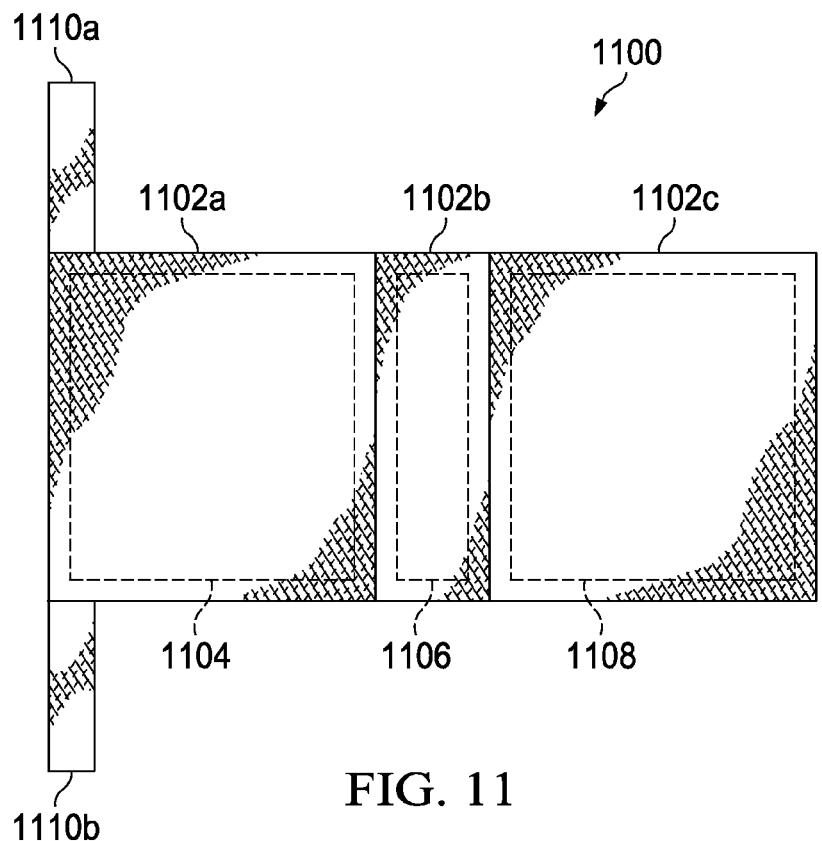
FIGS. 11 and 12 illustrate simplified diagrams of jackets that are unfolded and lying flat on an outer fabric sheet according to some embodiments of the present disclosure.
Figure 12:
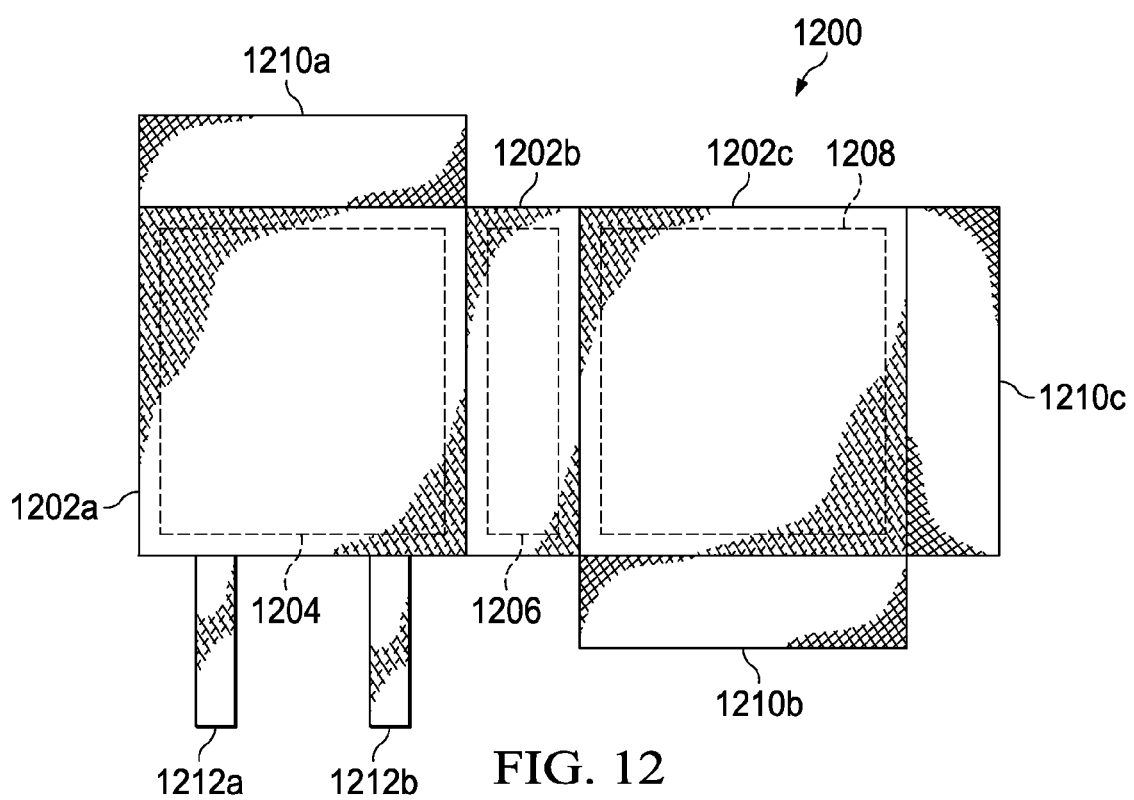

Because the jacket 802 (of FIGS. 8A-8D) can fold about the articulations, jacket 802 can be unfolded and laid flat. For example, FIGS. 11 and 12 illustrate simplified diagrams of jackets that are unfolded and lying flat on an outer fabric sheet. Thus, each of FIGS. 11 and 12 shows an inner side of the corresponding jacket. Turning to FIG. 11, FIG. 11 illustrates jacket 1100. Jacket 1100 includes upper portion 1102a, side portion 1102b, and lower portion 1102c, and attachment mechanisms 1110a-b. In this example, the attachment mechanisms include a pair of attachment straps, which are operable to secure the apparatus in a fixed position relative to the electronic device (e.g., by wrapping around the device and/or by wrapping around a structure that supports the device). Portions 1102a-c (in FIG. 11) correspond to portions 802a-c (in FIGS. 8A-8D), respectively. In particular, portion 802a (in FIGS. 8A-8D) may correspond to portion 1102a (in FIG. 11), portion 802b may correspond to portion 1102b (in FIG. 11), and portion 802c (in FIGS. 8A-8D) may correspond to portion 1102c (in FIG. 11). Panels 1104, 1106, and 1108 are embedded within fabric sheets of the corresponding portions 1102a-c (e.g., as described with respect to FIGS. 8A-8D). The attachment mechanism is coupled to at least one fabric sheet. In this case, a fabric sheet of the upper portion 1102a supports attachment straps 1110a and 1110b. The attachment straps are used to secure the jacket 1100 to an electronic device. Each strap comprises a first end coupled to the fabric sheet of the upper portion 1102a, and a second end configured to be wrapped about one or more of the exterior surfaces of the electronic device around a structure (e.g., a rack and/or device supports such as 402 and 404 of FIG. 4) that supports the electronic device. When jacket 1102 is wrapped around the electronic device, the jacket will wrap the electronic device in a manner similar to jacket 802 (in FIGS. 8A-8D). In addition, the attachment straps 1110a and 1110b further wrap around the device and are secured to the outer fabric sheet of portion 1102c. In some embodiments, ends of attachment straps 1110a and 1110b are secured to the portion 1102c using an attachment mechanism such as VELCRO, buttons, fabric stitches, or any other attachment mechanism. When stitching is used, the stitching fabric may be a high strength material (e.g., KEVLAR), a thermally resistant material, or match a material from which the fabric sheets are made.

Turning to FIG. 12, FIG. 12 illustrates jacket 1200. Jacket 1200 includes upper portion 1202a, side portion 1202b, lower portion 1202c, metal mesh 1210, and attachment mechanisms 1212a-b. In this example, the attachment mechanisms include a pair of attachment straps, which are operable to secure the apparatus in a fixed position relative to the electronic device (e.g., by wrapping around the device and/or by wrapping around a structure that supports the device). Portions 1202a-c (in FIG. 12) correspond to portions 802a-c (in FIGS. 8A-8D). In particular, portion 802a may correspond to portion 1202a (in FIG. 12), portion 802b (in FIGS. 8A-8D) may correspond to portion 1202b (in FIG. 12), and portion 802c (in FIGS. 8A-8D) may correspond to portion 1202c (in FIG. 12). Panels 1204, 1206, and 1208 are embedded within fabric sheets of the corresponding portions 1202a-c (e.g., as described with respect to FIGS. 8A-8D). The attachment mechanism is coupled to at least one fabric sheet. In this case, a fabric sheet of the upper portion 1202a supports attachment straps 1212a and 1212b. The attachment straps are used to secure the jacket 1200 to an electronic device. Each strap comprises a first end coupled to the fabric sheet of the upper portion 1202a, and a second end configured to be wrapped about one or more of the exterior surfaces of the electronic device around a structure (e.g., a rack and/or device supports such as 402 and 404 of FIG. 4) that supports the electronic device. A difference between jacket 1200 and jacket 802 is that jacket 802 wraps only a subset of the exterior surfaces of electronic device 300 while jacket 1200 would wrap all surfaces of the server 300. In the example of FIG. 12, the metal mesh 1210 is continuous through portions 1202a-c and further extends outside of the portions 1202a-c. Portions of the metal mesh that that extend outside of the panels (i.e., metal mesh portions) are labeled 1210a, 1210b, and 1210c. The metal mesh portion 1210a extends from upper portion 1202a, and both metal mesh portions 1210b and 1210c extend through the lower portion 1202c. Metal mesh portions 1210b and 1210c extend from different edges of lower portion 1202c; the different edges are perpendicular to one another. When jacket 1200 wraps an electronic device (such as device 300) the conductive mesh (i.e., metal mesh 1210) is continuous around the entire device thereby completely enclosing the electronic device. Thus, the metal mesh extends over an airflow intake for the electronic device. The metal mesh 1210 creates a faraday cage around the electronic device shielding it from electromagnetic waves. The fabric portions of the jacket 1200 (and the included panels) only cover three of the six sides of the electronic device while the metal mesh 1210 covers each of the six sides. When the jacket is attached to an electronic device (e.g., wrapping the device), the attachment straps 1212a and 1212b wrap over metal mesh portion 1210b to attach to an outer fabric sheet of portion 1210c (e.g., using an attachment mechanism similar to that described with respect to 1110a-b).

The systems, methods, and apparatuses disclosed herein may be applied by to existing systems by (1) adding insulating inserts shaped to fit into existing cabinets, (2) adding insulating inserts shaped to enclose existing electronic devices (e.g., a server, a router, a switch, a hard disk, a solid-state drive, etc.), (3) wrapping devices, storage systems, etc. with rigid and/or flexible apparatuses, and/or (4) manufacturing original equipment (e.g., chimneys in a cabinet, cabinets, electronic devices) including multilayer systems (e.g., panels) as disclosed herein. Such application can advantageously protect electronic devices from damage or limit such damage to maintain the device in an operable state, keep waste heat in an exhaust path (within a cabinet), increase cooling efficiency, lower utility costs, and/or reduce heat related component failures.

Additionally, it should be noted that with the examples provided above, interaction may be described in terms of two, three, or four components. However, this has been done for purposes of clarity and example only. In certain cases, it may be easier to describe one or more of the functionalities of a given set of flows by only referencing a limited number of electronic devices and/or physical components (e.g., layers, jackets, panels, apparatuses). It should be appreciated that the systems described herein are readily scalable and, further, can accommodate a large number of components, as well as more complicated/sophisticated arrangements and configurations. Accordingly, the examples provided should not limit the scope or inhibit the broad techniques of (and/or apparatuses for) shielding electronic devices, as potentially applied to a myriad of other architectures.

It is also important to note that the procedures described herein illustrate only some of the possible scenarios that may be executed by, or within, an apparatus for shielding electronic devices described herein. Some of these procedures may be deleted or removed where appropriate, or these procedures may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. The apparatus provides substantial flexibility in that any suitable arrangements, chronologies, configurations, and timing mechanisms may be provided without departing from the teachings of the present disclosure.

It should also be noted that many of the previous discussions may imply a single apparatus (e.g., a jacket, a shell, etc. as described herein). In reality, there is a multitude of apparatuses in the delivery tier in certain implementations of the present disclosure. Moreover, the present disclosure can readily be extended to apply to storage systems, data centers, headends, further upstream in the architecture, though this is not necessarily correlated to 'm' electronic devices. Any such permutations, scaling, and configurations are clearly within the broad scope of the present disclosure.

Endpoints 112a-e are representative of any type of client or user wishing to participate in a communication session in communication system 100 (e.g., or in any other virtual platform or online platform). Furthermore, endpoints 112a-e can be associated with individuals, clients, customers, or end users wishing to participate in a communication session in communication system 100 via some network. The term 'endpoint' is inclusive of devices used to initiate a communication, such as a computer, a personal digital assistant (PDA), a laptop or electronic notebook, a cellular telephone of any kind (e.g., a cellular telephone marked under the trade name (PHONE, BLACKBERRY, and/or GOOGLE DROID), an IP phone, a tablet (e.g., an IPAD), or any other device, component, element, or object capable of initiating voice, audio, video, media, and/or data exchanges within communication system 100. Endpoints 112*a-e* may also be inclusive of a suitable interface to the human user, such as a microphone, a display, or a keyboard or other terminal equipment. Endpoints 112*a-e* may also be any device that seeks to initiate a communication on behalf of another entity or element, such as a program, a proprietary conferencing device, a database, or any other component, device, element, or object capable of initiating an exchange within communication system 100. Data, as used herein in this document, refers to any type of numeric, voice, video, media, or script data, or any type of source or object code, or any other suitable information in any appropriate format that may be communicated from one point to another.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. An apparatus comprising:
   a plurality of projectile-resistant panels corresponding to exterior surfaces of an electronic device, wherein when the apparatus wraps the electronic device, each of the plurality of projectile-resistant panels covers a solid surface of the exterior surfaces of the electronic device and does not cover a perforated surface of the exterior surfaces of the electronic device; and
   wherein at least one of the plurality of projectile-resistant panels comprises a plurality of layers, the plurality of layers comprising: a first layer of a projectile-resistant ceramic, an electrically conductive mesh layer, a second layer of the projectile-resistant ceramic, and a fire resistant layer.

2. The apparatus of claim 1, further comprising
   at least one fabric sheet forming a plurality of pockets in which to receive the plurality of projectile-resistant panels; and
   an articulation located between a pair of adjacent pockets of the plurality of pockets, wherein the articulation facilitates the apparatus wrapping the electronic device by enabling rotation, relative to one another and about the articulation, between a first projectile-resistant panel located in a first pocket of the pair of adjacent pockets and a second projectile-resistant panel located in a second pocket of the pair of adjacent pockets.

3. The apparatus of claim 2, further comprising:
   an attachment mechanism coupled to the at least one fabric sheet, wherein the attachment mechanism is to secure the apparatus in a fixed position relative to the electronic device.

4. The apparatus of claim 3, wherein the attachment mechanism comprises:
   a strap, the strap comprising:
      a first end coupled to the at least one fabric sheet, and
      a second end configured to be wrapped about one or more of the exterior surfaces of the electronic device.

5. The apparatus of claim 2, wherein each of the plurality of pockets comprises:
   a first fabric sheet of the at least one fabric sheet;
   a second fabric sheet of the at least one fabric sheet; and
   an attachment mechanism that secures the first fabric sheet to the second fabric sheet, the attachment mechanism defining, at least in part, a cavity between the first fabric sheet and the second fabric sheet in which to hold at least one of the plurality of projectile-resistant panels.

6. The apparatus of claim 1, wherein each of the plurality of projectile-resistant panels comprises the electrically conductive mesh layer, and wherein the electrically conductive mesh layer is continuous through each of the plurality of projectile-resistant panels, and when the apparatus wraps the electronic device, the electrically conductive mesh layer defines a faraday cage around the electronic device.

7. The apparatus of claim 6, wherein the exterior surfaces of the electronic device comprise:
   a first subset of the exterior surfaces through which air is exchanged between an exterior and an interior of the electronic device, wherein the perforated surface is one of the first subset of the exterior surfaces, and
   a second subset of the exterior surfaces that substantially prevents air from being exchanged between the exterior and the interior of the electronic device, wherein the solid surface is one of the second subset of the exterior surfaces;
   wherein each of the plurality of projectile-resistant panels covers one of the second subset of exterior surfaces and does not cover any of the first subset of exterior surfaces; and
   wherein the electrically conductive mesh layer extends over all of the first subset of exterior surfaces and all of the second subset of the exterior surfaces.

8. The apparatus of claim 6, wherein the electrically conductive mesh layer is a metal mesh.

9. The apparatus of claim 1, wherein each of the plurality of projectile-resistant panels comprises a projectile-resistant material, wherein the projectile-resistant ceramic is the projectile-resistant material in the at least one of the plurality of projectile-resistant panels.

10. The apparatus of claim 9, wherein each of the plurality of projectile-resistant panels comprises the plurality of layers.

11. The apparatus of claim 9, wherein the projectile-resistant material is one selected from the group comprising the projectile-resistant ceramic, a projectile-resistant metal, a projectile-resistant nanomaterial, and a projectile-resistant synthetic material.

12. The apparatus of claim 1, wherein the electronic device is selected from a group consisting of a server, a router, a switch, a hard disk, and a solid-state drive.

13. A system comprising:
   one or more electronic devices, wherein an electronic device of the one or more electronic devices comprises:

a first subset of exterior surfaces through which air is exchanged between an exterior and an interior of the electronic device, and a second subset of the exterior surfaces that substantially prevents air from being exchanged between the exterior and the interior of the electronic device; and one or more jackets wrapping the one or more electronic devices, wherein a jacket of the one or more jacket comprises:

a plurality of panels, wherein at least one of the plurality of panels is a projectile-resistant panel, wherein each of the plurality of panels covers one of the second subset of the exterior surfaces and does not cover any of the first subset of the exterior surfaces, and wherein the projectile-resistant panel comprises a plurality of layers, the plurality of layers comprising: a first layer of a projectile-resistant ceramic, an electrically conductive mesh layer, a second layer of the projectile-resistant ceramic, and a fire resistant layer.

14. The system of claim 13, wherein the jacket further comprises:

at least one fabric sheet forming a plurality of pockets in which to hold the plurality of panels; and articulations located between adjacent pockets of the plurality of pockets, wherein the articulations facilitate the jacket wrapping the electronic device by enabling rotation of each of the plurality of panels relative to one another and about the articulations.

15. The system of claim 14, further comprising:

an attachment mechanism coupled to the at least one fabric sheet, wherein the attachment mechanism is to secure the jacket in a fixed position relative to the electronic device.

16. The system of claim 15, wherein the attachment mechanism comprises:

a strap, the strap comprising:

a first end coupled to the at least one fabric sheet, and a second end configured to be wrapped about one or more of the exterior surfaces of the electronic device.

17. The system of claim 13, wherein each of the plurality of panels comprises the electrically conductive mesh layer, and wherein the electrically conductive mesh layer is continuous through each of the plurality of panels, and when the jacket wraps the electronic device, the electrically conductive mesh layer defines a faraday cage around the electronic device.

18. The system of claim 13, further comprising a storage rack supporting the one or more electronic devices.

19. The system of claim 18, wherein the storage rack comprises:

a housing defining a space in which the one or more electronic devices are supported, wherein the at least one of the plurality of panels that is the projectile-resistant panel are only located adjacent to the housing.

20. The system of claim 13, wherein each of the one or more electronic devices is selected from a group consisting of a server, a router, a switch, a hard disk, and a solid-state drive.

* * * * *